US009736921B2

(12) United States Patent
Nagami et al.

(10) Patent No.: US 9,736,921 B2
(45) Date of Patent: Aug. 15, 2017

(54) METHOD FOR IMPEDANCE MATCHING OF PLASMA PROCESSING APPARATUS

(71) Applicant: Tokyo Electron Limited, Tokyo (JP)

(72) Inventors: Koichi Nagami, Miyagi (JP); Naoyuki Umehara, Miyagi (JP); Norikazu Yamada, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/284,681

(22) Filed: Oct. 4, 2016

(65) Prior Publication Data
US 2017/0099723 A1 Apr. 6, 2017

(30) Foreign Application Priority Data

Oct. 6, 2015 (JP) .................................. 2015-198314

(51) Int. Cl.
*H01J 7/24* (2006.01)
*H05H 1/46* (2006.01)
*H01J 37/32* (2006.01)

(52) U.S. Cl.
CPC ......... *H05H 1/46* (2013.01); *H01J 37/32165* (2013.01); *H01J 37/32183* (2013.01)

(58) Field of Classification Search
CPC .............. H01J 37/32165; H01J 37/32183
USPC ..................................... 315/111.21
See application file for complete search history.

(56) References Cited

U.S. PATENT DOCUMENTS

| 7,112,926 B2* | 9/2006 | Himori | H01J 37/32082 156/345.44 |
|---|---|---|---|
| 7,794,615 B2* | 9/2010 | Ogawa | H01J 37/32082 216/59 |
| 2013/0320852 A1* | 12/2013 | Kitano | G01R 25/00 315/111.21 |

FOREIGN PATENT DOCUMENTS

JP 3122618 A 10/2000

* cited by examiner

*Primary Examiner* — Thuy Vinh Tran
(74) *Attorney, Agent, or Firm* — Pearne & Gordon LLP

(57) ABSTRACT

An output of a modulated high frequency power is started from a high frequency power supply of a plasma processing apparatus. Here, a first period and a second period are repeated alternately. A moving average value of a load impedance of the high frequency power supply in a first sub-period in the past first period and a moving average value of a load impedance of the high frequency power supply in a second sub-period in the past first period are acquired. A frequency of the modulated high frequency power in the first sub-period and a frequency of the modulated high frequency power in the second sub-period are set according to the moving average values such that the load impedance of the high frequency power supply in the first sub-period and the load impedance of the high frequency power supply in the second sub-period approximate to a matching point.

7 Claims, 25 Drawing Sheets

METHOD FOR IMPEDANCE MATCHING OF PLASMA PROCESSING APPARATUS

CROSS-REFERENCE TO RELATED APPLICATION

This application claims the benefit of Japanese Patent Application No. 2015-198314 filed on Oct. 6, 2015, the entire disclosures of which are incorporated herein by reference.

TECHNICAL FIELD

The embodiments described herein pertain generally to a method for impedance matching of a plasma processing apparatus.

BACKGROUND

In the manufacture of an electronic device such as a semiconductor device, a plasma process, for example, a plasma etching process is performed on a processing target object. As one kind of plasma processing apparatuses used to perform the plasma process, there is known a capacitively coupled plasma processing apparatus.

The capacitively coupled plasma processing apparatus generally includes a processing vessel, an upper electrode, a lower electrode, a first high frequency power supply, a first matching device, a second high frequency power supply and a second matching device. The upper electrode and the lower electrode are disposed to be substantially parallel to each other with a space therebetween within the processing vessel. The first high frequency power supply generates a first high frequency power for plasma generation. The first high frequency power is supplied to either one of the upper electrode and the lower electrode. Further, the second high frequency power supply generates a second high frequency power for ion attraction. The second high frequency power is supplied to the lower electrode. Further, in the capacitively coupled plasma processing apparatus, a variable reactance element of the first matching device is adjusted to match an output impedance of the first high frequency power supply and an impedance at a load side thereof. Further, a variable reactance element of the second matching device is adjusted to match an output impedance of the second high frequency power supply and an impedance at a load side thereof. In this capacitively coupled plasma processing apparatus, a gas supplied into the processing vessel is dissociated by a high frequency electric field which is generated between the upper electrode and the lower electrode, so that the processing target object is processed by active species such as ions or radicals.

Further, in the capacitively coupled plasma processing apparatus, a modulated high frequency power, whose power is pulse-modulated, may be supplied from at least one of the first high frequency power supply and the second high frequency power supply. That is, there may be used a modulated high frequency power in which a first period and a second period are repeated alternately and a power in the second period is lower than a power in the first period. By way of example, a modulated high frequency power for plasma generation is used to suppress an increase of an electron temperature or to suppress a charging damage of the processing target object, and a modulated high frequency power for ion attraction is used to suppress a microloading effect.

If such a modulated high frequency power is used, an impedance at the load side, particularly, an impedance of plasma is varied in synchronization with a cycle of the pulse modulation. As a result, a reflection wave heading toward a corresponding high frequency power supply is increased at the beginning of the first period. To reduce this reflection wave, the impedance at the load side needs to be matched with an output impedance of the high frequency power supply, i.e., a matching point at a high speed. Since, however, a variable reactance element of a matching device is generally configured to adjust a reactance thereof by using a mechanical device such as a motor, it is difficult for the matching device to perform impedance matching at a high speed.

In this regard, there is employed a technique in which a high frequency power output from a high frequency power supply in a period including the starting of the first period is set to have a preset frequency higher than a frequency of the high frequency power in a steady period of the corresponding first period. This technique is described in, for example, Patent Document 1.

Patent Document 1: Japanese Patent No. 3,122,618

In the technique described in Patent Document 1, the preset frequency is a fixed frequency. Accordingly, the frequency of the high frequency power cannot be adaptively changed according to a variation of the impedance at the load side. As a result, there is a limit in suppressing the reflection wave. Further, a high modulation frequency is required for the pulse modulation of the power of the high frequency power. Thus, it is required to control the frequency of the high frequency power adaptively and rapidly according to a change in the impedance at the load side of the high frequency power supply.

SUMMARY

In one exemplary embodiment, there is provided a method for impedance matching of a plasma processing apparatus. The plasma processing apparatus includes a processing vessel, a first electrode, a second electrode, a first high frequency power supply, a second high frequency power supply, a first power feed line, a second power feed line, a first matching device and a second matching device. The first electrode and the second electrode are disposed with a space therebetween within the processing vessel. The first high frequency power supply is configured to output a high frequency power for plasma generation. The second high frequency power supply is configured to output a high frequency power for ion attraction. The first power feed line is configured to connect the first electrode or the second electrode to the first high frequency power supply. The second power feed line is configured to connect the second electrode to the second high frequency power supply. The first matching device is configured to adjust a load impedance of the first high frequency power supply. The second matching device is configured to adjust a load impedance of the second high frequency power supply.

The method includes (i) starting an output of a modulated high frequency power, which is set such that a power of the modulated high frequency power in a second period is smaller than a power of the modulated high frequency power in a first period, from one high frequency power supply of the first high frequency power supply and the second high frequency power supply, the first period and the second period being repeated alternately;

(ii) adjusting, by one matching device of the first matching device and the second matching device which corresponds to the one high frequency power supply, a reactance of a variable reactance element of the one matching device such that the load impedance of the one high frequency power supply approximates to a matching point;

(iii) acquiring a first moving average value and a second moving average value by a power supply controller corresponding to the one high frequency power supply, the first moving average value being a moving average value of the load impedance of the one high frequency power supply in a first sub-period from a start point to a preset point of each first period after the adjusting of the reactance of the variable reactance element of the one matching device, and the second moving average value being a moving average value of the load impedance of the one high frequency power supply in a second sub-period from the preset point to an end point of each first period after the adjusting of the reactance of the variable reactance element of the one matching device; and (iv) setting, by the power supply controller corresponding to the one high frequency power supply, after the first moving average value and the second moving average value are acquired, a frequency of the modulated high frequency power output from the one high frequency power supply, in each of the first sub-period and the second sub-period such that the load impedance of the one high frequency power supply in the first sub-period, which is estimated from the first moving average value, and the load impedance of the one high frequency power supply in the second sub-period, which is estimated from the second moving average value, approximate to the matching point.

In the method according to the exemplary embodiment, if the output of the modulated high frequency power is started, the reactance of the variable reactance element of the one matching device is adjusted. By way of example, the reactance of the variable reactance element is adjusted according to the moving average value of the load impedance in a period which is set within each first period, such that the load impedance of the one high frequency power supply approximates to the matching point. Since the adjusting of the reactance of the variable reactance element of the matching device, that is, the control of the variable reactance element does not follow a variation in the load impedance within the first period, a relatively larger reflection wave is generated in the first sub-period, as compared to the second sub-period. Thus, in the method according to the present exemplary embodiment, the moving average value of the load impedance of the one high frequency power supply in each of the first sub-periods and the second sub-periods in the past first periods, that is, the first moving average value and the second moving average value are acquired. Further, the frequency of the modulated high frequency power is set according to the first moving average value and the second moving average value in the first sub-period and the second sub-period. Therefore, the frequency of the modulated high frequency power is adjusted adaptively and rapidly according to the variation in the load impedance of the one high frequency power supply in the first period.

The method may further include (v) adjusting, by the other matching device of the first matching device and the second matching device, a reactance of a variable reactance element of the other matching device such that the load impedance of the other high frequency power supply approximates to the matching point;

(vi) acquiring a third moving average value and a fourth moving average value by a power supply controller corresponding to the other high frequency power supply, the third moving average value being a moving average value of the load impedance of the other high frequency power supply in the first sub-period after the adjusting of the reactance of the variable reactance element of the other matching device, and the fourth moving average value being a moving average value of the load impedance of the other high frequency power supply in the second sub-period after the adjusting of the reactance of the variable reactance element of the other matching device; and (vii) setting, by the power supply controller corresponding to the other high frequency power supply, after the third moving average value and the fourth moving average value are acquired, a frequency of a high frequency power output from the other high frequency power supply in each of the first sub-period and the second sub-period such that the load impedance of the other high frequency power supply in the first sub-period, which is estimated from the third moving average value, and the load impedance of the other high frequency power supply in the second sub-period, which is estimated from the fourth moving average value, approximate to the matching point.

While the one high frequency power supply is outputting the modulated high frequency power, the other high frequency power supply may output a continuous power, that is, continuously output a high frequency power having a substantially constant power. Further, while the one high frequency power supply is outputting the modulated high frequency power, the other high frequency power supply may output a modulated high frequency power synchronized with the modulated high frequency power of the one high frequency power supply. In any of these cases, the load impedance of the other high frequency power supply is varied in the first period. In the method of the present exemplary embodiment, to cope with the variation in the load impedance, the frequency of the modulated high frequency power output from the other high frequency power supply in each of the first sub-period and the second sub-period is set based on the moving average values of the load impedance of the other high frequency power supply in each of the first sub-periods and the second sub-periods in the past first periods, that is, the third moving average value and the fourth moving average value. Thus, the frequency of the modulated high frequency power is adjusted adaptively and rapidly according to the variation in the load impedance of the other high frequency power supply in the first period.

The method may further include adjusting the reactance of the variable reactance element of the one matching device such that a median impedance between the load impedance of the one high frequency power supply in the first sub-period, which is estimated from the first moving average value, and the load impedance of the one high frequency power supply in the second sub-period, which is estimated from the second moving average value, approximates to the matching point.

The method may further include adjusting the reactance of the variable reactance element of the one matching device according to the second moving average value such that the load impedance of the one high frequency power supply in the second sub-period, which is estimated from the second moving average value, approximates to the matching point.

The method may further include setting, by the power supply controller corresponding to the one high frequency power supply, a power of the modulated high frequency power output from the one high frequency power supply, such that the power of the modulated high frequency power output from the one high frequency power supply in the first sub-period is larger than the power of the modulated high frequency power output from the one high frequency power supply in the second sub-period. As stated above, if the reactance of the variable reactance element of the one matching device is adjusted such that the load impedance of the one high frequency power supply in the second sub-period approximates to the matching point, a reflection wave may not be sufficiently suppressed even if the frequency of the modulated high frequency power which is output in the first sub-period is adjusted. As a result, the power of the modulated high frequency power supplied to plasma in the first sub-period may be insufficient. According to the exemplary embodiment, however, since the power of the modulated high frequency power in the first sub-period is enhanced, it is possible to supply the modulated high frequency power having a sufficient power level to the plasma in the first sub-period.

In the exemplary embodiment, the one high frequency power supply may output the high frequency power having a power larger than 0 W in the second period. The method may further include (viii) acquiring a fifth moving average value and a sixth moving average value by the power supply controller corresponding to the one high frequency power supply, the fifth moving average value being a moving average value of the load impedance of the one high frequency power supply in a third sub-period from a start point to a preset point of each second period after the adjusting of the reactance of the variable reactance element of the one matching device, and the sixth moving average value being a moving average value of the load impedance of the one high frequency power supply in a fourth sub-period from the preset point to an end point of each second period after the adjusting of the reactance of the variable reactance element of the one matching device; and (ix) setting, by the power supply controller corresponding to the one high frequency power supply, after the fifth moving average value and the sixth moving average value are acquired, a frequency of the modulated high frequency power output from the one high frequency power supply, in each of the third sub-period and the fourth sub-period such that the load impedance of the one high frequency power supply in the third sub-period, which is estimated from the fifth moving average value, and the load impedance of the one high frequency power supply in the fourth sub-period, which is estimated from the sixth moving average value, approximate to the matching point, In the exemplary embodiment, the frequency of the modulated high frequency power is adjusted adaptively and rapidly according to the variation in the load impedance of the one high frequency power supply in the second period.

The method may further include setting, by the power supply controller corresponding to the one high frequency power supply, a power of the modulated high frequency power output from the one high frequency power supply, such that the power of the modulated high frequency power output from the one high frequency power supply in the third sub-period is larger than the power of the modulated high frequency power output from the one high frequency power supply in the fourth sub-period. The reactance of the variable reactance element of the one matching device is adjusted such that the load impedance in the first period approximates to the matching point. Accordingly, the load impedance in the third sub-period, particularly, tends to be largely deviated from the matching point. Thus, only by setting the frequency of the modulated high frequency power in the third sub-period, the reflection wave in the third sub-period may not be sufficiently suppressed. According to the exemplary embodiment, however, since the power of the modulated high frequency power in the third sub-period is enhanced, it is possible to supply the modulated high frequency power having a sufficient power level to the plasma in the third sub-period.

According to the exemplary embodiments as described above, it is possible to adjust the frequency of the high frequency power adaptively and rapidly according to the variation in the load impedance of the high frequency power supply of the plasma processing apparatus.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
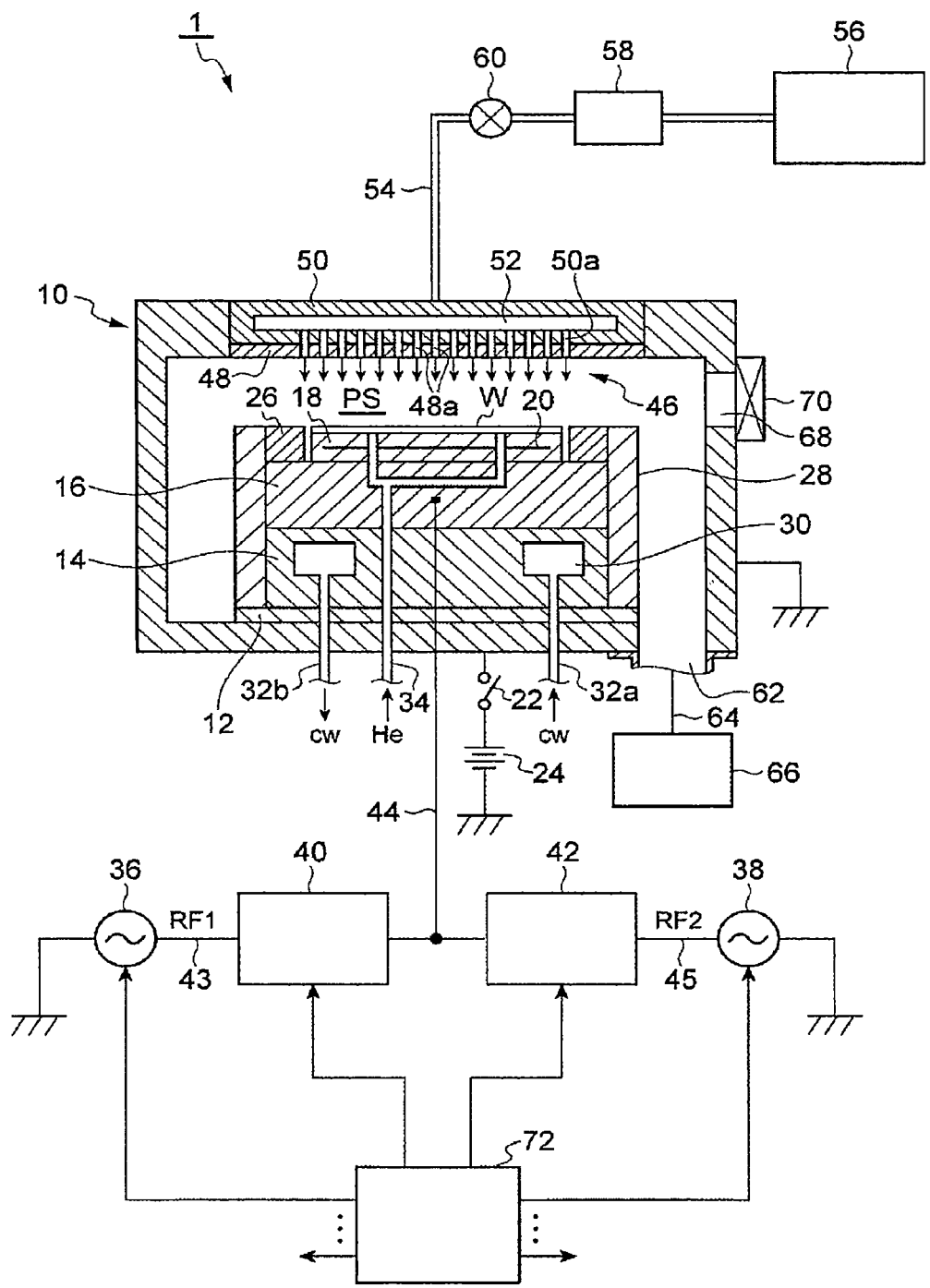
FIG. 1 is a diagram schematically illustrating a configuration of a plasma processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

First, a plasma processing apparatus to which a method for impedance matching according to an exemplary embodiment can be applied will be described. FIG. 1 is a diagram schematically illustrating a configuration of a plasma processing apparatus according to an exemplary embodiment. The plasma processing apparatus 1 shown in FIG. 1 is configured as a capacitively coupled plasma processing apparatus. The plasma processing apparatus 1 includes a processing vessel 10. The processing vessel 10 has a substantially cylindrical shape, and is made of a material such as aluminum. An inner wall surface of the processing vessel 10 is anodically oxidized. The processing vessel 10 is grounded.

An insulating plate 12 is provided at a bottom portion of the processing vessel 10. The insulating plate 12 is made of, by way of non-limiting example, ceramic. A supporting table 14 is provided on the insulating plate 12. The supporting table 14 has a substantially cylindrical shape, and a susceptor 16 is provided on the supporting table 14. The susceptor 16 is made of a conductive material such as aluminum, and is configured as a lower electrode.

An electrostatic chuck 18 is provided on the susceptor 16. The electrostatic chuck 18 has a structure in which an electrode 20 made of a conductive film is embedded between insulating layers or insulating sheets. The electrode 20 of the electrostatic chuck 18 is electrically connected to a DC power supply 24 via a switch 22. The electrostatic chuck 18 is configured to generate an electrostatic attracting force by a DC voltage applied from the DC power supply 24, and hold a processing target object (hereinafter, referred to as "wafer W") thereon by this electrostatic attracting force. A focus ring 26 is disposed on the susceptor 16 to surround the electrostatic chuck 18. Further, a cylindrical inner wall member 28 is disposed on side surfaces of the susceptor 16 and the supporting table 14. This inner wall member 28 is made of, but not limited to, quartz.

A coolant path 30 is formed within the supporting table 14. For example, the coolant path 30 is extended in a spiral shape around a central axis line which is extended in a vertical direction. A coolant cw (for example, cooling water) is supplied through a pipeline 32a into the coolant path 30 from a chiller unit provided at the outside of the processing vessel 10. The coolant supplied into the coolant path 30 is then returned back into the chiller unit via a pipeline 32b. By adjusting a temperature of the coolant through the chiller unit, a temperature of the wafer W can be adjusted. Further, in the plasma processing apparatus 1, a heat transfer gas (e.g., a He gas) supplied through a gas supply line 34 is introduced into a gap between a top surface of the electrostatic chuck 18 and a rear surface of the wafer W.

A conductor 44 (e.g., a power feed rod) is connected to the susceptor 16. A high frequency power supply 36 is connected to the conductor 44 via a matching device 40, and a high frequency power supply 38 is also connected to this conductor 44 via a matching device 42. The high frequency power supply 36 is configured to output a high frequency power RF1 for plasma generation. A basic frequency $f_{B1}$ of the high frequency power RF1 output from the high frequency power supply 36 is, for example, 100 MHz. The high frequency power supply 38 is configured to output a high frequency power RF2 for attracting ions from plasma into the wafer W. A basic frequency $f_{B2}$ of the high frequency power RF2 output from the high frequency power supply 38 is, for example, 13.56 MHz.

The matching device 40 and the conductor 44 constitute a part of a power feed line 43 which is configured to transmit the high frequency power RF1 from the high frequency power supply 36 to the susceptor 16. Further, the matching device 42 and the conductor 44 constitute a part of a power feed line 45 which is configured to transmit the high frequency power RF2 from the high frequency power supply 38 to the susceptor 16.

An upper electrode 46 is provided at a ceiling portion of the processing vessel 10. A processing space PS in which plasma is generated is formed between the upper electrode 46 and the susceptor 16 within the processing vessel 10. The upper electrode 46 has a ceiling plate 48 and a supporting body 50. The ceiling plate 48 is provided with a multiple number of gas discharge holes 48a. The ceiling plate 48 is made of a silicon-based material such as, but not limited to, Si or SiC. The supporting body 50 is a member which supports the ceiling plate 48 in a detachable manner and is made of aluminium. A surface of the supporting body 50 is anodically oxidized.

A gas buffer room 52 is provided within the supporting body 50. Further, the supporting body 50 is provided with a multiple number of gas through holes 50a. The gas through holes 50a are extended from the gas buffer room 52 and communicated with the gas discharge holes 48a, respectively. The gas buffer room 52 is connected to a processing gas supply source 56 via a gas supply line 54. A flow rate controller 58 (e.g., mass flow controller) and an opening/closing valve 60 are provided at a portion of the gas supply line 54. A gas from the processing gas supply source 56 is introduced into the gas buffer room 52 after its flow rate is adjusted by the flow rate controller 58. The gas introduced into the gas buffer room 52 is discharged into the processing space PS from the gas discharge holes 48a.

When viewed from the top, an annular space is formed between the susceptor 16 and a sidewall of the processing vessel 10 and between the supporting table 14 and the sidewall of the processing vessel 10. A bottom portion of the space is connected to an exhaust opening 62 of the processing vessel 10. An exhaust line 64 communicating with the exhaust opening 62 is connected to a bottom portion of the processing vessel 10. The exhaust line 64 is connected to an exhaust device 66. The exhaust device 66 is equipped with a vacuum pump such as a turbo molecular pump, and is configured to decompress the internal space of the processing vessel 10 to a required pressure level. Further, an opening 68 for carry-in/out of the wafer W is formed at the sidewall of the processing vessel 10. A gate valve 70 for opening/closing the opening 68 is provided at the sidewall of the processing vessel 10.

Further, the plasma processing apparatus 1 is equipped with a main controller 72. The main controller 72 includes one or more microcomputers. The main controller 72 controls operations of individual components of the plasma processing apparatus 1, e.g., the high frequency power supplies 36 and 38, the matching devices 40 and 42, the flow rate controller 58, the opening/closing valve 60 and the exhaust device 66, and controls an overall operation (sequence) of the plasma processing apparatus 1 according to software (programs) and recipe data stored in an external memory or an internal memory. Further, the main controller 72 is connected with a manipulation panel for man-machine interface including an input device such as a keyboard and a display such as a liquid crystal display, and an external memory device configured to store various programs and various data such as recipes and setting values.

A basic operation of this plasma processing apparatus 1 is performed as follows. First, the gate valve 70 is opened, and a wafer W as a processing target is carried into the processing vessel 10 through the opening 68. The wafer W carried into the processing vessel 10 is placed on the electrostatic chuck 18. Then, a processing gas is introduced into the processing vessel 10 from the processing gas supply source 56, and the exhaust device 66 is operated such that a pressure in the internal space of the processing vessel 10 is set to a preset pressure value. Further, the high frequency power RF1 from the high frequency power supply 36 is supplied to the susceptor 16 (or upper electrode 46), and the high frequency power RF2 from the high frequency power supply 38 is supplied to the susceptor 16. Further, the DC voltage from the DC power supply 24 is applied to the electrode 20 of the electrostatic chuck 18, and the wafer W is held on the electrostatic chuck 18. The processing gas supplied into the processing vessel 10 is excited by high frequency electric charges generated between the susceptor 16 and the upper electrode 46. As a result, plasma is generated. The wafer W is processed by radicals and/or ions from the generated plasma.

This plasma processing apparatus 1 is configured to output a modulated high frequency power from at least one of the high frequency power supply 36 and the high frequency power supply 38. To elaborate, the plasma processing apparatus 1 is configured to be operated by selecting one of a first mode, a second mode and a third mode under the control of the main controller 72 based on a recipe. In the first mode, a modulated high frequency power MRF1 is output from the high frequency power supply 36 as the high frequency power RF1, and a continuous power CRF2 is output from the high frequency power supply 38 as the high frequency power RF2. In the second mode, a modulated high frequency power MFR2 is output from the high frequency power supply 38 as the high frequency power RF2, and a continuous power CRF1 is output from the high frequency power supply 36 as the high frequency power RF1. In the third mode, modulated high frequency powers MRF1 and MRF2, which are synchronized with each other, are output from the high frequency power supply 36 and the high frequency power supply 38, respectively. Further, in the following description, the modulated high frequency power MRF1 and the continuous power CRF1 together may be sometimes referred to as the high frequency power RF1, and the modulated high frequency power MRF2 and the continuous power CRF2 may be sometimes referred to as the high frequency power RF2.

Figure 2:
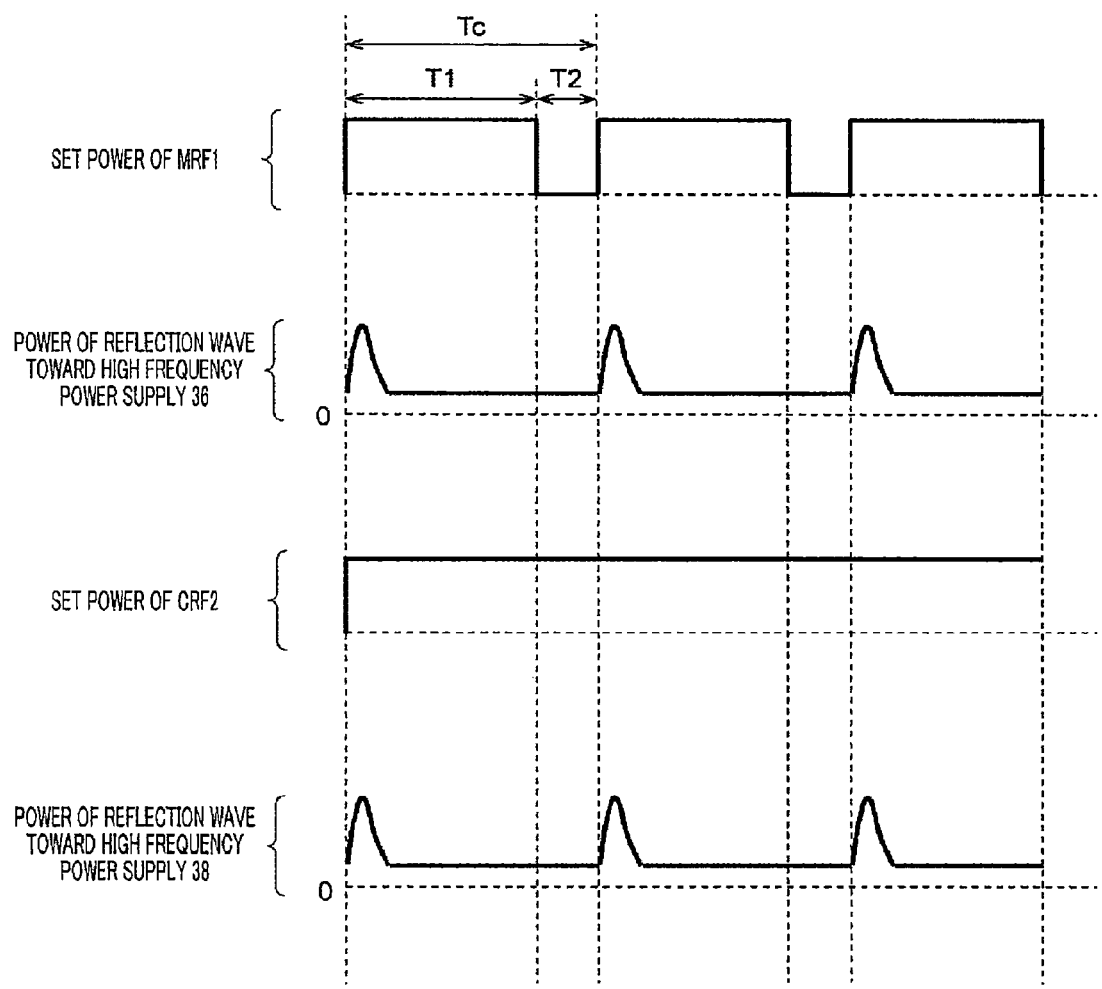
FIG. 2 is a diagram illustrating timing charts in a first mode.
Figure 3:
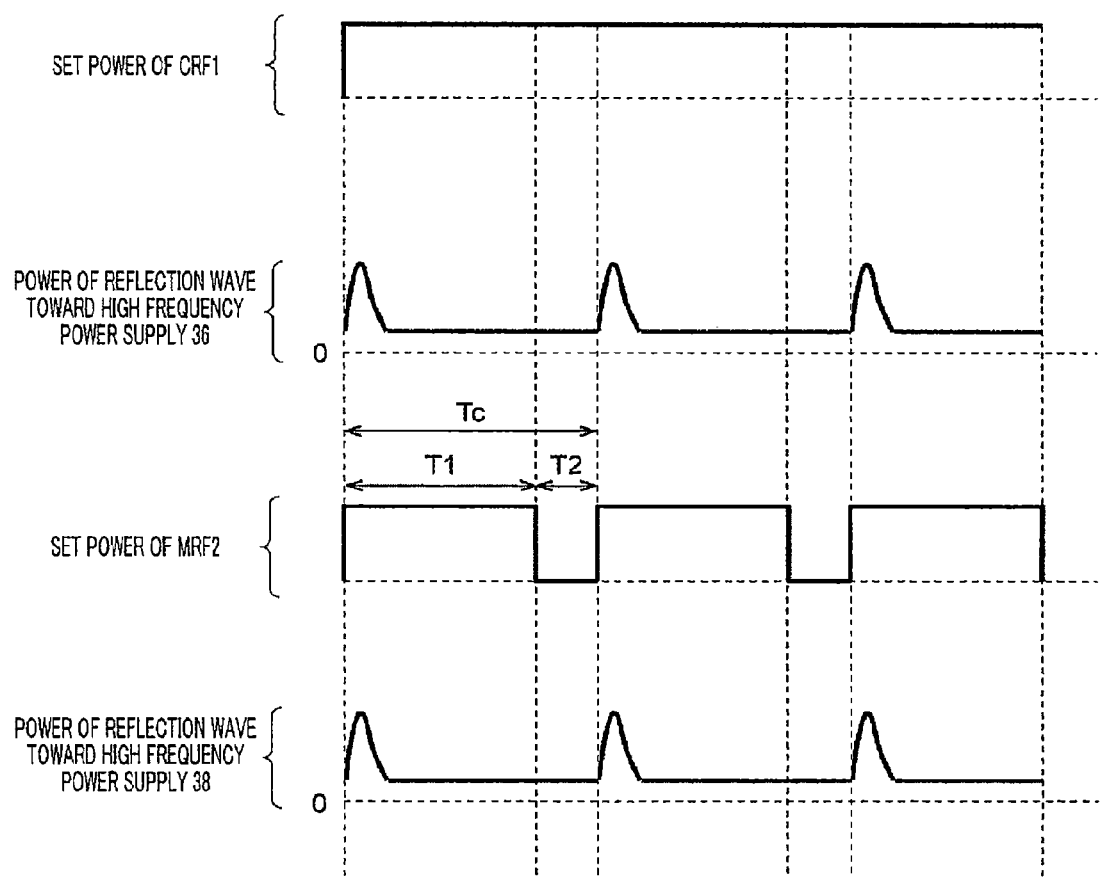
FIG. 3 is a diagram illustrating timing charts in a second mode.
Figure 4:
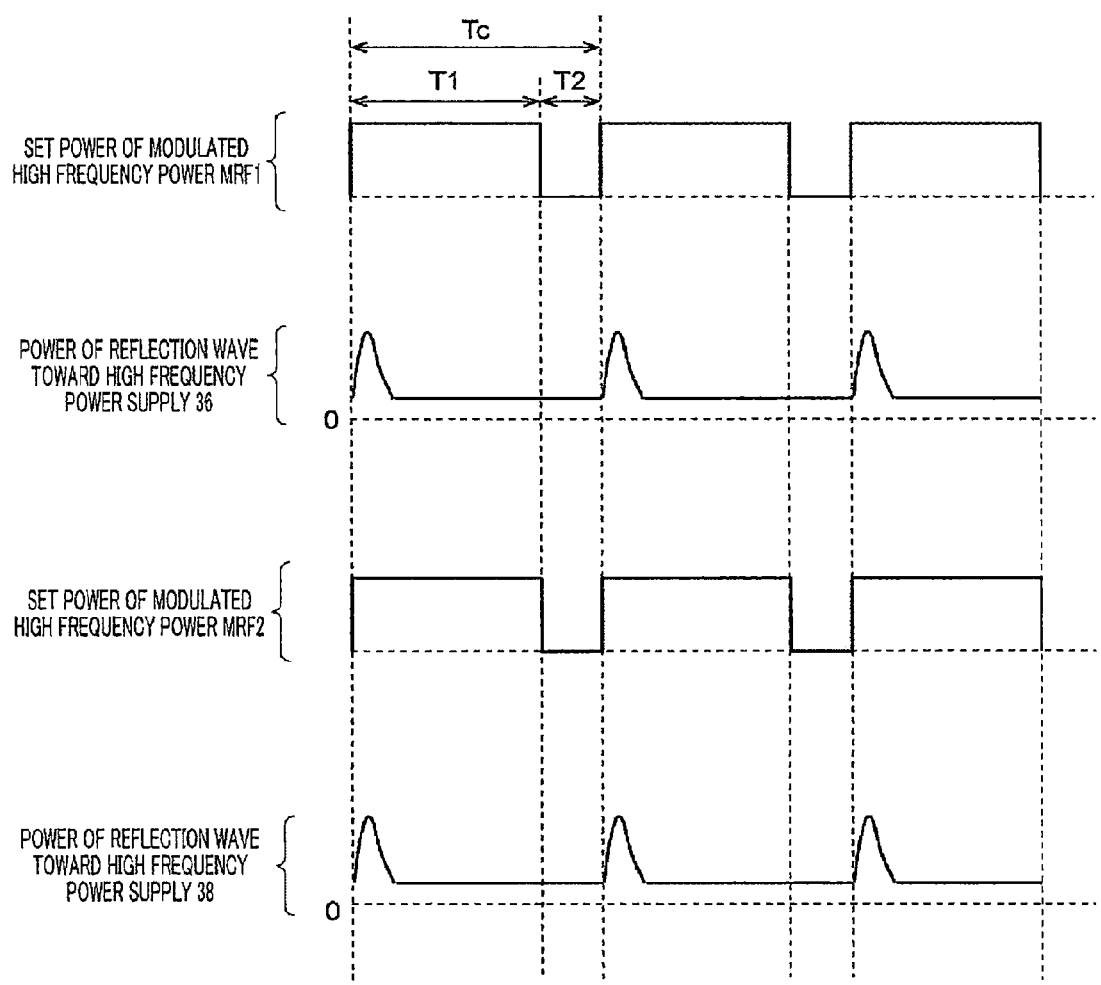
FIG. 4 is a diagram illustrating timing chart in a third mode.

FIG. 2 is a diagram illustrating timing charts in the first mode, and FIG. 3 is a diagram illustrating timing charts in the second mode. Further, FIG. 4 is a diagram illustrating timing charts in the third mode. The following description is made with reference to FIG. 2 to FIG. 4 appropriately.

Under the control of the main controller 72 based on the recipe, the high frequency power supply 36 is configured to output the continuous power CFR1 or the modulated high frequency power MRF1, selectively. To elaborate, as depicted in FIG. 2 and FIG. 4, the high frequency power supply 36 is configured to output the modulated high frequency power MRF1 in the first mode and the third mode. As shown in FIG. 2 and FIG. 4, the modulated high frequency power MRF1 is a high frequency power obtained by pulse-modulating the power of the high frequency power for plasma generation. That is, the modulated high frequency power MRF1 is a high frequency power which is modulated such that a set power in a second period T2 is lower than a set power in a first period T1. The first period T1 and the second period T2 are repeated alternately. A duty ratio of the modulated high frequency power MRF1, that is, a ratio of a time length of the first period T1 with respect to a time length of a single cycle Tc, which is the sum of a single first period T1 and a single second period T2, can be controlled to a required value. By way of non-limiting example, the duty ratio of the modulated high frequency power MRF1 may be controlled within a range from 10% to 90%. Moreover, a modulation frequency of the modulated high frequency power MRF1, that is, a reciprocal of the single cycle Tc may be controlled to a certain modulation frequency. By way of example, the modulation frequency of the modulated high frequency power MRF1 may be controlled within a range from, but not limited to, 1 kHz to 100 kHz. In addition, the power of the modulated high frequency power MRF1 in the second period T2 may be 0 W or larger than 0 W.

Further, the high frequency power supply 36 is also configured to output the continuous power CRF1 in the second mode. As shown in FIG. 3, the continuous power CRF1 is a high frequency power having a substantially constant power.

Under the control of the main controller 72 based on a recipe, the high frequency power supply 38 is configured to output the modulated high frequency power MRF2 or the continuous power CRF2 selectively. To elaborate, as depicted in FIG. 3 and FIG. 4, the high frequency power supply 38 is configured to output the modulated high frequency power MRF2 in the second mode and the third mode. As depicted in FIG. 3 and FIG. 4, the modulated high frequency power MRF2 is a high frequency power obtained by pulse-modulating the power of the high frequency power RF2. That is, the modulated high frequency power MRF2 is a high frequency power which is modulated such that a set power in a second period T2 is lower than a set power in a first period T1. The first period T1 and the second period T2 are repeated alternately. A duty ratio of the modulated high frequency power MRF2, that is, a ratio of a time length of the first period T1 with respect to a time length of a single cycle Tc, which is the sum of a single first period T1 and a single second period T2, can be controlled to a required value. By way of non-limiting example, the duty ratio of the modulated high frequency power MRF2 may be controllable within a range from 10% to 90%. Moreover, a modulation frequency of the modulated high frequency power MRF2, that is, a reciprocal of the single cycle Tc may be controlled to a certain modulation frequency. The modulation frequency of the modulated high frequency power MRF2 may be controlled to be in a range from, but not limited to, 1 kHz to 100 kHz. In addition, the power of the modulated high frequency power MRF2 in the second period T2 may be 0 W or larger than 0 W. Furthermore, in the third mode, the modulated high frequency power MRF1 and the modulated high frequency power MRF2 are synchronized.

Further, the high frequency power supply 38 is also configured to output the continuous power CRF2 in the first mode. As depicted in FIG. 2, the continuous power CRF2 is a high frequency power having a substantially constant power.

As illustrated in FIG. 2 to FIG. 4, in any of the first mode, the second mode and the third mode, a reflection wave heading toward the high frequency power supply 36 and a reflection wave heading toward the high frequency power supply 38 are generated in a state where an output impedance of the high frequency power supply 36 and an impedance at a load side ("load impedance") of the high frequency power supply 36 are not matched and an output impedance of the high frequency power supply 38 and an impedance at a load side ("load impedance") of the high frequency power supply 38 are not matched. The matching device 40 is configured to match the output impedance of the high frequency power supply 36 and the load impedance of the high frequency power supply 36 by adjusting a reactance of a variable reactance element of the matching device 40. For example, the matching device 40 adjusts the reactance of the variable reactance element to reduce a difference between a moving average value of average values of the load impedance of the high frequency power supply 36 in each of the multiple first periods T1 and a matching point (e.g., 50Ω, phase of 0). Further, the matching device 42 is configured to match the output impedance of the high frequency power supply 38 and the load impedance of the high frequency power supply 38 by adjusting a reactance of a variable reactance element of the matching device 42. By way of example, the matching device 42 adjusts the reactance of the variable reactance element to reduce a difference between the matching point (e.g., 50Ω, phase of 0) and a moving average value of average values of the load impedance of the high frequency power supply 38 in each of the multiple first periods T1. Accordingly, the aforementioned reflection wave is substantially suppressed. However, impedance of plasma is varied greatly between a start point of the first period T1 and a certain point of the first period T1, so that a reflection wave having a relatively high power is generated. In order to suppress this reflection wave, it may be considered to adjust the reactance of the variable reactance element plural times in the first period T1. Since, however, the variable reactance element of the matching device 40 and the variable reactance element of the matching device 42 are devices configured to adjust the reactance by a mechanical device such as a motor, they cannot respond to a high speed control. Thus, in the plasma processing apparatus 1, the high frequency power supply 36 and the high frequency power supply 38 are configured to change the frequency of the high frequency power thereof.

Figure 5:
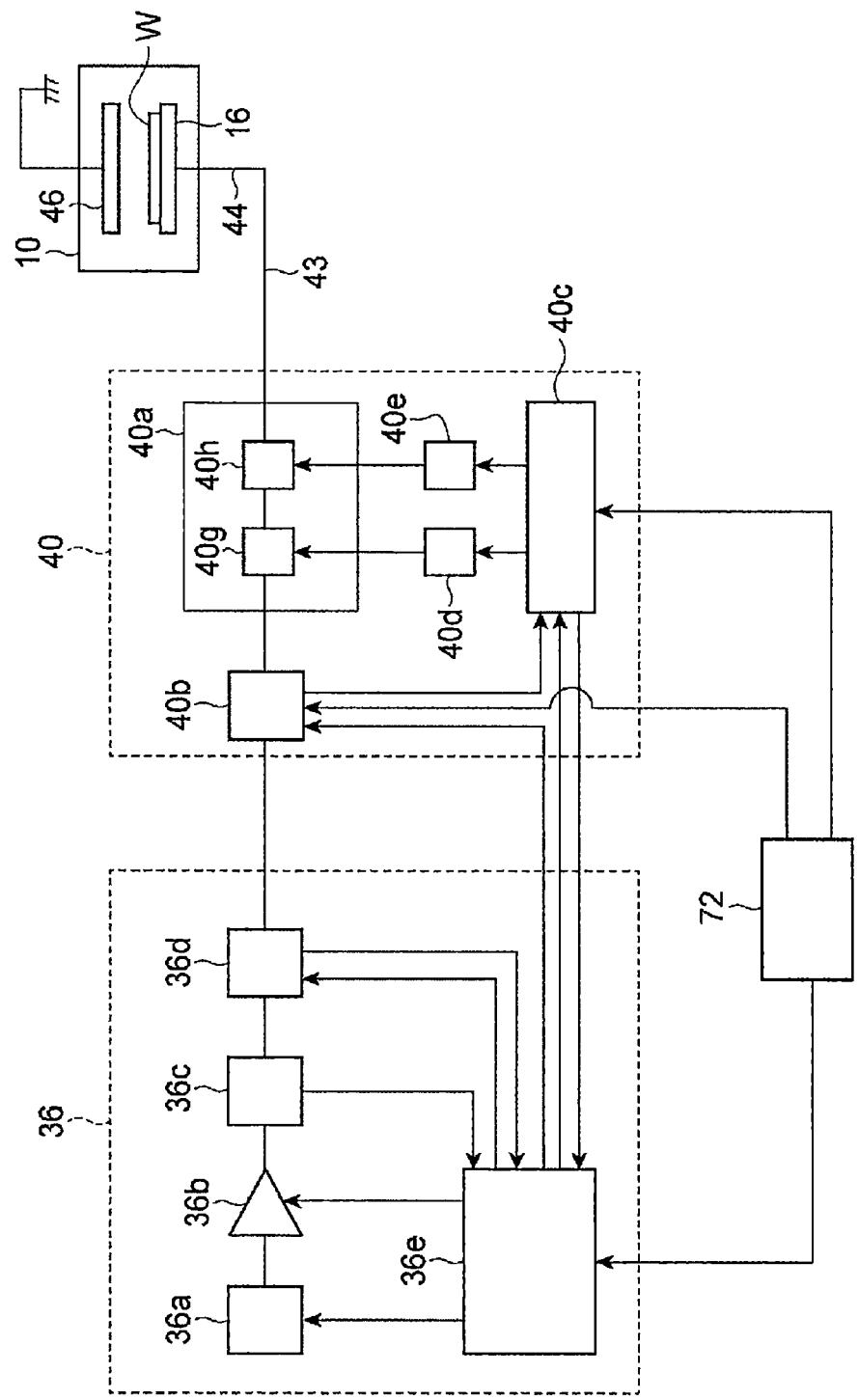
FIG. 5 is a diagram illustrating a configuration of a high frequency power supply 36 and a matching device 40.
Figure 6:
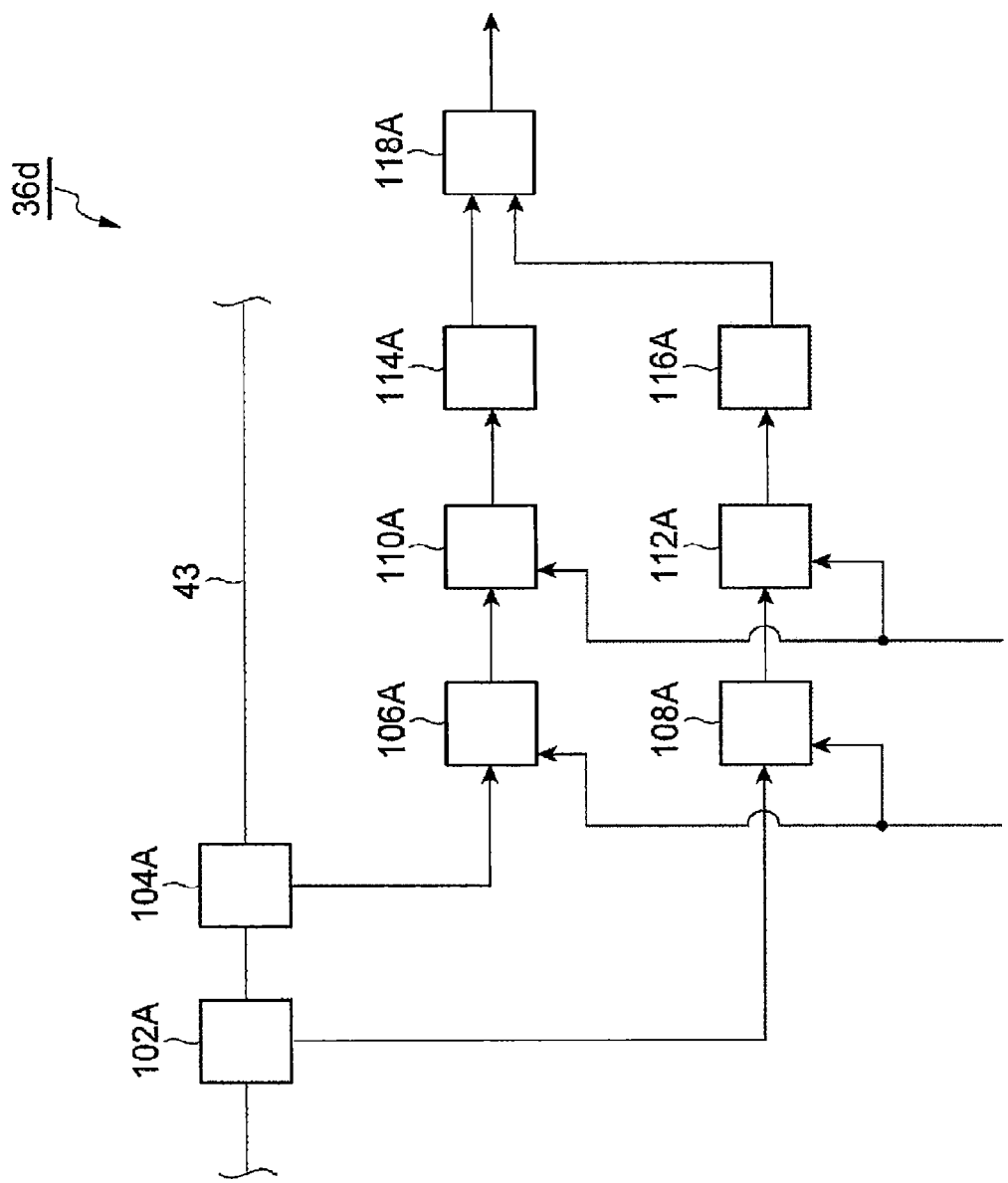
FIG. 6 is a diagram illustrating a configuration of an impedance sensor of the high frequency power supply 36.
Figure 8:
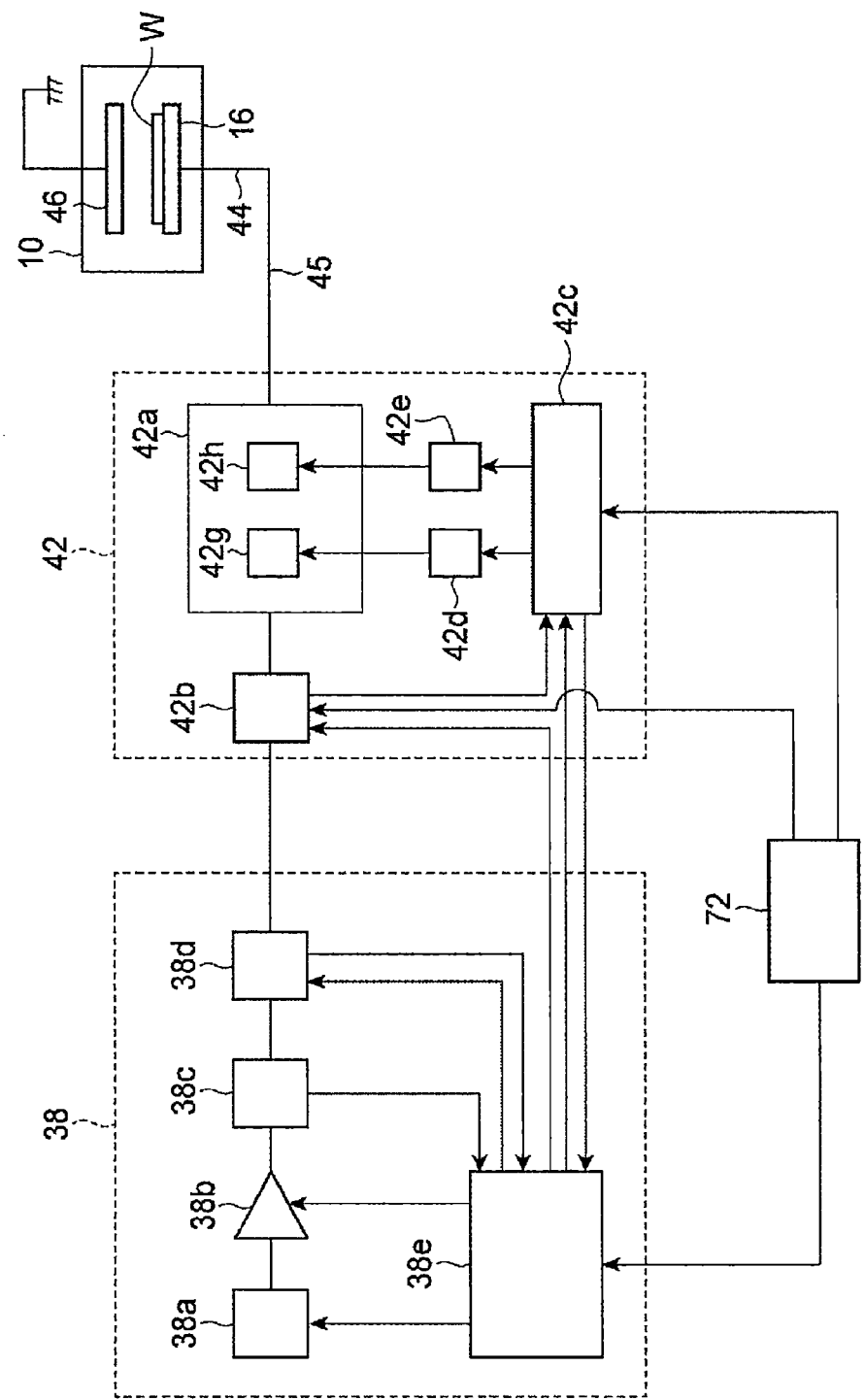
FIG. 8 is a diagram illustrating a configuration of a high frequency power supply 38 and a matching device 42.
Figure 9:
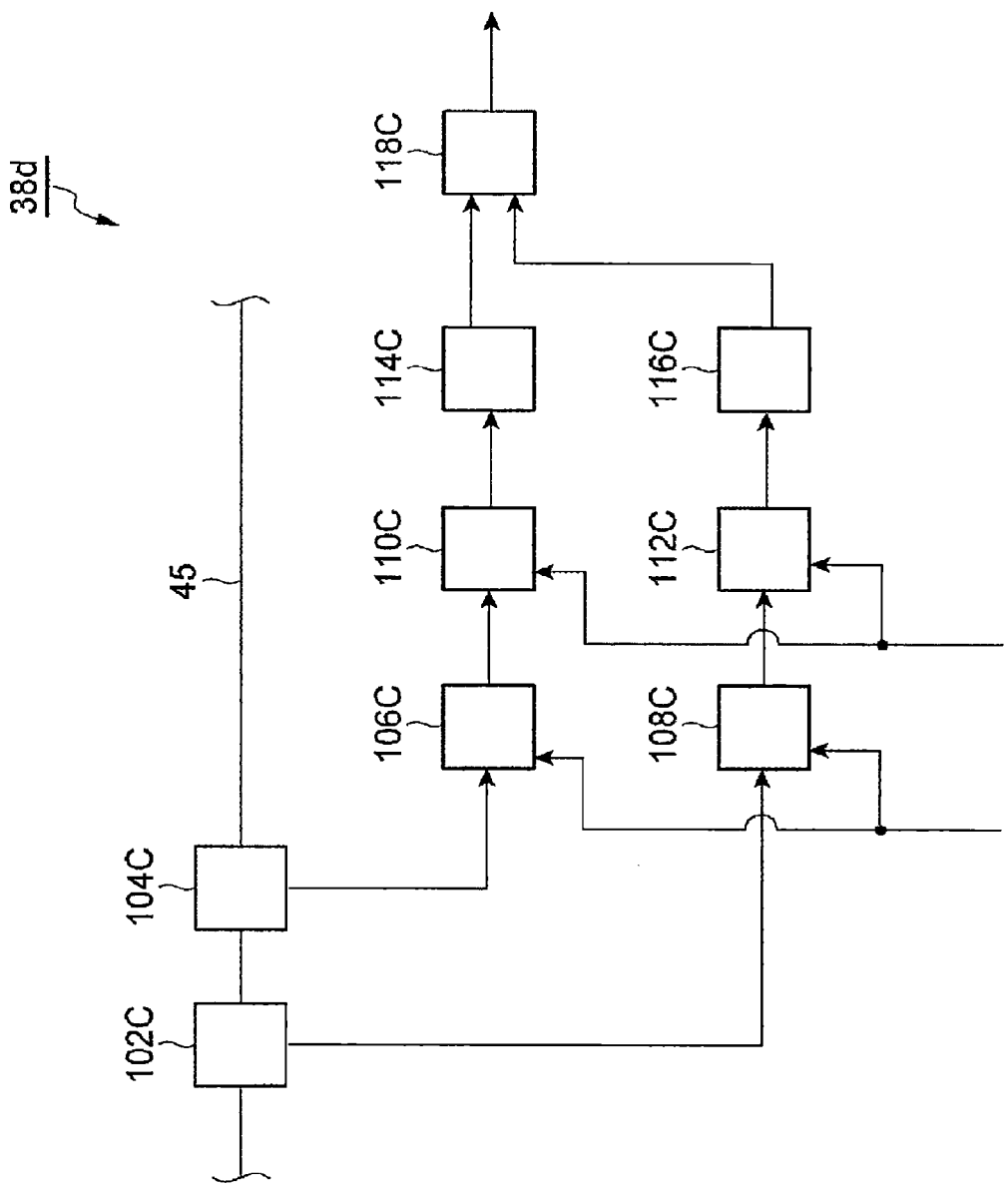
FIG. 9 is a diagram illustrating a configuration of an impedance sensor of the high frequency power supply 38.

Now, referring to FIG. 5 to FIG. 10, the high frequency power supply 36 and the matching device 40, and the high frequency power supply 38 and the matching device 42 will be described in detail. FIG. 5 is a diagram illustrating a configuration of the high frequency power supply 36 and the matching device 40; FIG. 6, a diagram illustrating a configuration of an impedance sensor of the high frequency power supply 36; and FIG. 7, a diagram illustrating a configuration of an impedance sensor of the matching device 40. Further, FIG. 8 is a diagram illustrating a configuration of the high frequency power supply 38 and the matching device 42; FIG. 9, a diagram illustrating a configuration of an impedance sensor of the high frequency power supply 38; and FIG. 10, a diagram illustrating a configuration of an impedance sensor of the matching device 42.

As illustrated in FIG. 5, in one exemplary embodiment, the high frequency power supply 36 is equipped with an oscillator 36a, a power amplifier 36b, a power sensor 36c, an impedance sensor 36d and a power supply controller 36e. The power supply controller 36e is made up of a processor such as a CPU and controls the oscillator 36a, the power amplifier 36b, the power sensor 36c and the impedance sensor 36d by applying control signals to the oscillator 36a, the power amplifier 36b, the power sensor 36c and the impedance sensor 36d with a signal output from the main controller 72, a signal output from a matching controller 40c to be described later, a signal output from the power sensor 36c and a signal output from the impedance sensor 36d.

The signal sent from the main controller 72 to the power supply controller 36e includes a mode designation signal designating any one of the first mode, the second mode and the third mode, a frequency designation signal designating the basic frequency $f_{B1}$, and a modulation designation signal designating the modulation frequency and the duty ratio. Further, in case that the high frequency power supply 36 is operated in the first mode or the third mode as stated above, the signal sent from the main controller 72 to the power supply controller 36e further includes a first power designation signal which designates the power of the modulated high frequency power MRF1 in the first period T1 and the power of the modulated high frequency power MRF1 in the second period T2. Further, in case that the high frequency power supply 36 is operated in the aforementioned second mode, the signal sent from the main controller 72 to the power supply controller 36e further includes a second power designation signal designating the power of the continuous power CRF1.

The power supply controller 36e applies a frequency control signal for setting the basic frequency $f_{B1}$ designated by the frequency designation signal to the oscillator 36a when starting the output of the high frequency power RF1 from the high frequency power supply 36, that is, the modulated high frequency power MRF1 or the continuous power CRF1. The oscillator 36a receives the frequency control signal from the power supply controller 36e, and outputs the high frequency power of the frequency specified by the corresponding frequency control signal.

Further, after the output of the high frequency power RF1 from the high frequency power supply 36 is started, if the power supply controller 36e receives a completion signal indicating the completion of the impedance matching from the matching device 40, the power supply controller 36e applies, to the oscillator 36a, a frequency control signal for setting the frequency of the high frequency power RF1 in each of a first sub-period Ts1 and a second sub-period Ts2 to be described later. To elaborate, the power supply controller 36e receives, from the impedance sensor 36d, a moving average value Imp11 of the load impedance in the past first sub-periods Ts1 and a moving average value Imp12 of the load impedance in the past second sub-periods Ts2. The moving average value Imp11 and the moving average value Imp12 are updated at a time interval equivalent to an integer multiple of the single cycle Tc, and then, are input to the power supply controller 36e. The power supply controller 36e outputs, to the oscillator 36a, a frequency control signal for setting the frequency of the high frequency power RF1 in each of the first sub-period Ts1 and the second sub-period Ts2 in order to allow the load impedance of the high frequency power supply 36 in the first sub-period Ts1, which is estimated from the moving average value Imp11, and the load impedance of the high frequency power supply 36 in the second sub-period Ts2, which is estimated from the moving average value Imp12 to approximate to the matching point. The oscillator 36a sets the frequency of the high frequency power in the first sub-period Ts1 and the frequency of the high frequency power in the second sub-period Ts2 according to the corresponding frequency control signal (see FIG. 18 to FIG. 20). In the present disclosure, the allowing of the load impedance to approximate to the matching point implies that the load impedance is matched with the matching point, ideally.

Further, in case that the modulated high frequency power MRF1 has a power larger than 0 W in the second period T2 (see FIG. 24), the power supply controller 36e receives, from the impedance sensor 36d, a moving average value Imp13 of the load impedance in past third sub-periods Ts3 and a moving average value Imp14 of the load impedance in past fourth sub-periods Ts4. The moving average value Imp13 and the moving average value Imp14 are updated at a time interval equivalent to an integer multiple of the single cycle Tc, and then, are input to the power supply controller 36e. The power supply controller 36e outputs, to the oscillator 36a, a frequency control signal for setting the frequency of the modulated high frequency power MRF1 in each of the third sub-period Ts3 and the fourth sub-period Ts4 in order to allow the load impedance of the high frequency power supply 36 in the third sub-period Ts3, which is estimated from the moving average value Imp13, and the load impedance of the high frequency power supply 36 in the fourth sub-period Ts4, which is estimated from the moving average value Imp14 to approximate to the matching point. The oscillator 36a sets the frequency of the high frequency power in the third sub-period Ts3 and the frequency of the high frequency power in the fourth sub-period Ts4 according to the corresponding frequency control signal (see FIG. 25).

An output of the oscillator 36a is connected to an input of the power amplifier 36b. The power amplifier 36b generates the high frequency power RF1 by amplifying the high frequency power which is output from the oscillator 36a, and outputs the generated high frequency power RF1. The power amplifier 36b is controlled by the power supply controller 36e.

When the output of the high frequency power RF1 is started, if the mode designated by the mode designation signal is either the first mode or the third mode, the power supply controller 36e outputs, to the power amplifier 36b, a first power control signal for setting the power of the modulated high frequency power MRF1 in each of the first period T1 and the second period T2 according to the modulation designation signal and the first power designation signal from the main controller 72. In the first mode and the third mode, the power amplifier 36b amplifies the high frequency power from the oscillator 36a according to the first power control signal and outputs the modulated high frequency power MRF1. Meanwhile, when the output of the high frequency power RF1 is started, if the mode specified by the mode designation signal from the main controller 72 is the second mode, the power supply controller 36e outputs, to the power amplifier 36b, a second power control signal for setting the power of the continuous power CRF1 according to the second power designation signal from the main controller 72. In the second mode, the power amplifier 36b amplifies the high frequency power from the oscillator 36a according to the second power control signal and outputs the continuous power CRF1.

Further, in the exemplary embodiment, after the output of the modulated high frequency power MRF1 from the high frequency power supply 36 is started, if the power supply controller 36e receives a completion signal indicating the completion of the impedance matching from the matching device 40, the power supply controller 36e determines whether the moving average value Imp11 and the moving average value Imp12 are within a range (adjustable range) where they can be matched with the matching point by adjusting the frequency of the modulated high frequency power MRF1. If at least one of the moving average value Imp11 and the moving average value Imp12 is out of the adjustable range, the power supply controller 36e outputs, to the matching device 40, a matching control signal for allowing a median impedance between the moving average value Imp11 and the moving average value Imp12 to approximate to the matching point. That is, the power supply controller 36e outputs, to the matching device 40, a matching control signal for allowing a median impedance between the load impedance of the high frequency power supply 36 in the first sub-period Ts1 and the load impedance of the high frequency power supply 36 in the second sub-period Ts2 to approximate to the matching point.

Alternatively, in case that at least one of the moving average value Imp11 and the moving average value Imp12 is out of the adjustable range, the power supply controller 36e outputs, to the matching device 40, a matching control signal for allowing the load impedance of the high frequency power supply 36, which is estimated from the moving average value Imp12, to approximate to the matching point. That is, the power supply controller 36e outputs, to the matching device 40, a matching control signal for allowing the load impedance of the high frequency power supply 36 in the second sub-period Ts2 to approximate to the matching point. If it is determined that the load impedance of the high frequency power supply 36 in the first sub-period Ts1 is out of the adjustable range, the power supply controller 36e outputs, to the power amplifier 36b, a power control signal for setting the power of the modulated high frequency power MRF1 in the first sub-period Ts1 to be higher than that in the second sub-period Ts2. The power amplifier 36b adjusts the power of the modulated high frequency power MRF1 in the first sub-period Ts1 and the power of the modulated high frequency power MRF1 in the second sub-period Ts2 according to the corresponding power control signal (see FIG. 23).

Further, if the modulated high frequency power MRF1 has a power larger than 0 W in the second period T2, the power supply controller 36e may output, to the power amplifier 36b, a power control signal for setting the power of the modulated high frequency power MRF1 in the third sub-period Ts3 to be higher than that in the fourth sub-period Ts4. In this case, the power amplifier 36b adjusts the power of the modulated high frequency power MRF1 in the third sub-period Ts3 and the power of the modulated high frequency power MRF1 in the fourth sub-period Ts4 according to the corresponding power control signal (see FIG. 25).

The power sensor 36c is provided at a rear end of the power amplifier 36b. The power sensor 36c includes a directional coupler, a progressive wave power detector and a reflection wave power detector. The directional coupler outputs a part of a progressive wave of the high frequency power RF1 to the progressive wave power detector, and outputs a reflection wave thereof to the reflection wave power detector. A frequency specifying signal for specifying a set frequency of the high frequency power RF1 is applied to the power sensor 36c from the power supply controller 36e. The progressive wave power detector generates a measurement value of a power of a component of the set frequency specified by the frequency specifying signal among all frequency components of the progressive wave, that is, a progressive wave power measurement value. This progressive wave power measurement value is applied to the power supply controller 36e for power feedback.

The frequency specifying signal is also sent to the reflection wave power detector from the power supply controller 36e. The reflection wave power detector generates a measurement value of a power of a component of the set frequency specified by the frequency specifying signal among all frequency components of the reflection wave, that is, a reflection wave power measurement value PR11, and also generates a measurement value of a total power of all the frequency components of the reflection wave, that is, a reflection wave power measurement value PR12. The reflection wave power measurement value PR11 is applied to the main controller 72 to be displayed on a monitor. Further, the reflection wave power measurement value PR11 may be used in the power supply controller 36e to set the first sub-period Ts1 and the second sub-period Ts2. Furthermore, the reflection wave power measurement value PR11 may be used in the power supply controller 36e to set the third sub-period Ts3 and the fourth sub-period Ts4. Moreover, the reflection wave power measurement value PR12 is sent to the power supply controller 36e to protect the power amplifier 36b.

The impedance sensor 36d calculates a moving average value Imp11 of the load impedance of the high frequency power supply 36 in a preset number of most recent first sub-periods Ts1, and also calculates a moving average value Imp12 of the load impedance of the high frequency power supply 36 in a preset number of most recent second sub-periods Ts2. Each of the first sub-periods Ts1 is a time period set between a start point of the corresponding first period T1 and a certain point of the first period T1. In the first sub-period Ts1, the power of the reflection wave is relatively large. Each of the second sub-periods Ts2 is a time period set between an end point of the first sub-period Ts1 within the first period T1 and an end point of the first period T1. In the exemplary embodiment, each first period T1 is divided into the first sub-period Ts1 and the second sub-period Ts2.

A ratio of a time length of the first sub-period Ts1 with respect to a time length of the first period T1 decreases as the time length of the first period T1 increases, and a ratio of a time length of the second sub-period Ts2 with respect to the time length of the first period T1 decreases as the time length of the first period T1 increases. In the exemplary embodiment, the power supply controller 36e has a table in which the time lengths of the first sub-period Ts1 and the second sub-period Ts2 are stored in relation to the modulation frequency and the duty ratio of the modulated high frequency power. By referring to the table, the power supply controller 36e outputs a sub-period specifying signal for specifying the first sub-period Ts1 and the second sub-period Ts2 to the impedance sensor 36d. Further, a time length of the third sub-period Ts3 and a time length of the fourth sub-period Ts4 may also be stored in the aforementioned table in relation to the modulation frequency and the duty ratio of the modulated high frequency power. By referring to this table, the power supply controller 36e may output a sub-period specifying signal for specifying the third sub-period Ts3 and the fourth sub-period Ts4 to the impedance sensor 36d.

In another exemplary embodiment, based on time series data of the aforementioned reflection wave power measurement value PR11, the power supply controller 36e may set a period in which the reflection wave power measurement value PR11 is stabilized to or below a preset value in each first period T1 as a second sub-period Ts2, and sets a period prior to the second sub-period Ts2 within each first period T1 as a first sub-period Ts1. In this case as well, the power supply controller 36e outputs a sub-period specifying signal for specifying the first sub-period Ts1 and the second sub-period Ts2 to the impedance sensor 36d. Further, based on the time series data of the reflection wave power measurement value PR11, the power supply controller 36e may set a period in which the reflection wave power measurement value PR11 is stabilized to or below a preset value in each second period T2 as a fourth sub-period Ts4, and sets a period prior to the fourth sub-period Ts4 within each second period T2 as a third sub-period Ts3. In this case as well, the power supply controller 36e outputs a sub-period specifying signal for specifying the third sub-period Ts3 and the fourth sub-period Ts4 to the impedance sensor 36d.

As shown in FIG. 6, in the exemplary embodiment, the impedance sensor 36d includes a current detector 102A, a voltage detector 104A, a filter 106A, a filter 108A, an average value calculator 110A, an average value calculator 112A, a moving average value calculator 114A, a moving average value calculator 116A and an impedance calculator 118A.

The voltage detector 104A detects a voltage waveform of the high frequency power RF1 (modulated high frequency power MRF1 or continuous power CRF1) which is transmitted on the power feed line 43, and outputs a voltage waveform analog signal indicating the corresponding voltage waveform. This voltage waveform analog signal is input to the filter 106A. The filter 106A generates a voltage waveform digital signal by digitizing the voltage waveform analog signal input thereto. Further, the filter 106A receives the frequency specifying signal from the power supply controller 36e and generates a filtered voltage waveform signal by extracting, from the voltage waveform digital signal, a frequency component corresponding to the frequency specified by the frequency specifying signal. Further, the filter 106A may be implemented by, for example, a FPGA (Field Programmable Gate Array).

The filtered voltage waveform signal generated by the filter 106A is output to the average value calculator 110A. Further, the sub-period specifying signal from the power supply controller 36e is also input to the average value calculator 110A. The average value calculator 110A calculates, from the filtered voltage waveform signal, an average value VA11 of the voltages in the first sub-period Ts1 within each first period T1, which is specified by the sub-period specifying signal. Further, the average value calculator 110A also calculates, from the filtered voltage waveform signal, an average value VA12 of the voltages in the second sub-period Ts2 within each first period T1, which is specified by the sub-period specifying signal.

Further, the average value calculator 110A may calculate, from the filtered voltage waveform signal, an average value VA13 of the voltages in the third sub-period Ts3 within each second period T2, which is specified by the sub-period specifying signal. Further, the average value calculator 110A may calculate, from the filtered voltage waveform signal, an average value VA14 of the voltages in the fourth sub-period Ts4 within each second period T2, which is specified by the sub-period specifying signal. Further, the average value calculator 110A may be implemented by, for example, a FPGA (Field Programmable Gate Array).

The average value VA11 and the average value VA12 obtained by the average value calculator 110A are output to the moving average value calculator 114A. The moving average value calculator 114A calculates a moving average value VMA11 of, among previously obtained average values VA11, the average values VA11 obtained from the voltages of the high frequency power RF1 in the preset number of most recent first sub-periods Ts1. Further, the moving average value calculator 114A calculates a moving average value VMA12 of, among previously obtained average values VA12, the average values VA12 obtained from the voltages of the high frequency power RF1 in the preset number of most recent second sub-periods Ts2. The moving average values VMA11 and VMA12 obtained by the moving average value calculator 114A are output to the impedance calculator 118A.

Further, the moving average value calculator 114A may calculate a moving average value VMA13 of, among previously obtained average values VA13, the average values VA13 obtained from the voltages of the high frequency power RF1 in a preset number of most recent third sub-periods Ts3. Further, the moving average value calculator 114A may calculate a moving average value VMA14 of, among previously obtained average values VA14, the average values VA14 obtained from the voltages of the high frequency power RF1 in a preset number of most recent fourth sub-periods Ts4. The moving average values VMA13 and VMA14 obtained by the moving average value calculator 114A are output to the impedance calculator 118A. The moving average value calculator 114A may be implemented by, for example, a CPU. Alternatively, the moving average value calculator 114A may be implemented by a FPGA (Field Programmable Gate Array).

The current detector 102A detects a current waveform of the high frequency power RF1 (modulated high frequency power MRF1 or continuous power CRF1) which is transmitted on the power feed line 43, and outputs a current waveform analog signal indicating the corresponding current waveform. This current waveform analog signal is input to the filter 108A. The filter 108A generates a current waveform digital signal by digitizing the current waveform analog signal input thereto. Further, the filter 108A receives the frequency specifying signal from the power supply controller 36e and generates a filtered current waveform signal by extracting, from the current waveform digital signal, a frequency component corresponding to the frequency specified by the frequency specifying signal. Further, the filter 108A may be implemented by, for example, a FPGA (Field Programmable Gate Array).

The filtered current waveform signal generated by the filter 108A is output to the average value calculator 112A. Further, the sub-period specifying signal from the power supply controller 36e is also applied to the average value calculator 112A. The average value calculator 112A calculates, from the filtered current waveform signal, an average value IA11 of the electric currents in the first sub-period Ts1 within each first period T1, which is specified by the sub-period specifying signal. Further, the average value calculator 112A also calculates, from the filtered current waveform signal, an average value IA12 of the electric currents in the second sub-period Ts2 within each first period T1, which is specified by the sub-period specifying signal.

Further, the average value calculator 112A may calculate, from the filtered current waveform signal, an average value IA13 of the electric currents in the third sub-period Ts3 within each second period T2, which is specified by the sub-period specifying signal. Further, the average value calculator 112A may calculate, from the filtered current waveform signal, an average value IA14 of the electric current in the fourth sub-period Ts4 within each second period T2, which is specified by the sub-period specifying signal. Further, the average value calculator 112A may be implemented by, for example, a FPGA (Field Programmable Gate Array).

The average value IA11 and the average value IA12 obtained by the average value calculator 112A are output to the moving average value calculator 116A. The moving average value calculator 116A calculates a moving average value IMA11 of, among previously obtained average values IA11, the average values IA11 obtained from the electric currents of the high frequency power RF1 in the preset number of most recent first sub-periods Ts1. Further, the moving average value calculator 116A calculates a moving average value IMA12 of, among previously obtained average values IA12, the average values IA12 obtained from the electric currents of the high frequency power RF1 in the preset number of most recent second sub-periods Ts2. The moving average value calculator 116A may be implemented by, by way of non-limiting example, a CPU. Alternatively, the moving average value calculator 116A may be implemented by a FPGA (Field Programmable Gate Array). The moving average values IMA11 and IMA12 obtained by the moving average value calculator 116A are output to the impedance calculator 118A.

Further, the moving average value calculator 116A may calculate a moving average value IMA13 of, among previously obtained average values IA13, the average values IA13 obtained from the electric currents of the high frequency power RF1 in the preset number of most recent third sub-periods Ts3. Further, the moving average value calculator 116A may calculate a moving average value IMA14 of, among previously obtained average values IA14, the average values IA14 obtained from the electric currents of the high frequency power RF1 in the preset number of most recent fourth sub-periods Ts4. The moving average values IMA13 and IMA14 obtained by the moving average value calculator 116A are output to the impedance calculator 118A. The moving average value calculator 116A may be implemented by, for example, a CPU. Alternatively, the moving average value calculator 116A may be implemented by a FPGA (Field Programmable Gate Array).

The impedance calculator 118A calculates, from the moving average value IMA11 and the moving average value VMA11, a moving average value Imp11 of the load impedance of the high frequency power supply 36 in the preset number of most recent first sub-periods Ts1. This moving average value Imp11 includes an absolute value and a phase component. Further, the impedance calculator 118A calculates, from the moving average value IMA12 and the moving average value VMA12, a moving average value Imp12 of the load impedance of the high frequency power supply 36 in the preset number of most recent second sub-periods Ts2. This moving average value Imp12 includes an absolute value and a phase component. The moving average values Imp11 and Imp12 obtained by the impedance calculator 118A are output to the power supply controller 36e. The moving average values Imp11 and Imp12 are used to set the frequency of the high frequency power RF1 in the power supply controller 36e, as stated above.

Further, in the exemplary embodiment, the impedance calculator 118A may calculate, from the moving average value IMA13 and the moving average value VMA13, a moving average value Imp13 of the load impedance of the high frequency power supply 36 in the preset number of most recent third sub-periods Ts3. This moving average value Imp13 includes an absolute value and a phase component. Further, the impedance calculator 118A may calculate, from the moving average value IMA14 and the moving average value VMA14, a moving average value Imp14 of the load impedance of the high frequency power supply 36 in the preset number of most recent fourth sub-periods Ts4. This moving average value Imp14 includes an absolute value and a phase component. The moving average values Imp13 and Imp14 obtained by the impedance calculator 118A are output to the power supply controller 36e. The moving average values Imp13 and Imp14 may be used to set the frequency of the high frequency power RF1 in the power supply controller 36e, as stated above.

Referring back to FIG. 5, the matching device 40 is equipped with a matching circuit 40a, an impedance sensor 40b, a matching controller 40c and actuators 40d and 40e. The matching circuit 40a includes variable reactance elements 40g and 40h. The variable reactance elements 40g and 40h may be, for example, variable capacitors. Further, the matching circuit 40a may further include an inductor or the like.

The matching controller 40c is operated under the control of the main controller 72, and is configured to adjust a reactance of each of the variable reactance elements 40g and 40h by controlling the actuators 40d and 40e according to a measurement value of the load impedance output from the impedance sensor 40b such that the load impedance approximates to the matching point. The actuators 40d and 40e may be, by way of non-limiting example, motors.

Figure 7:
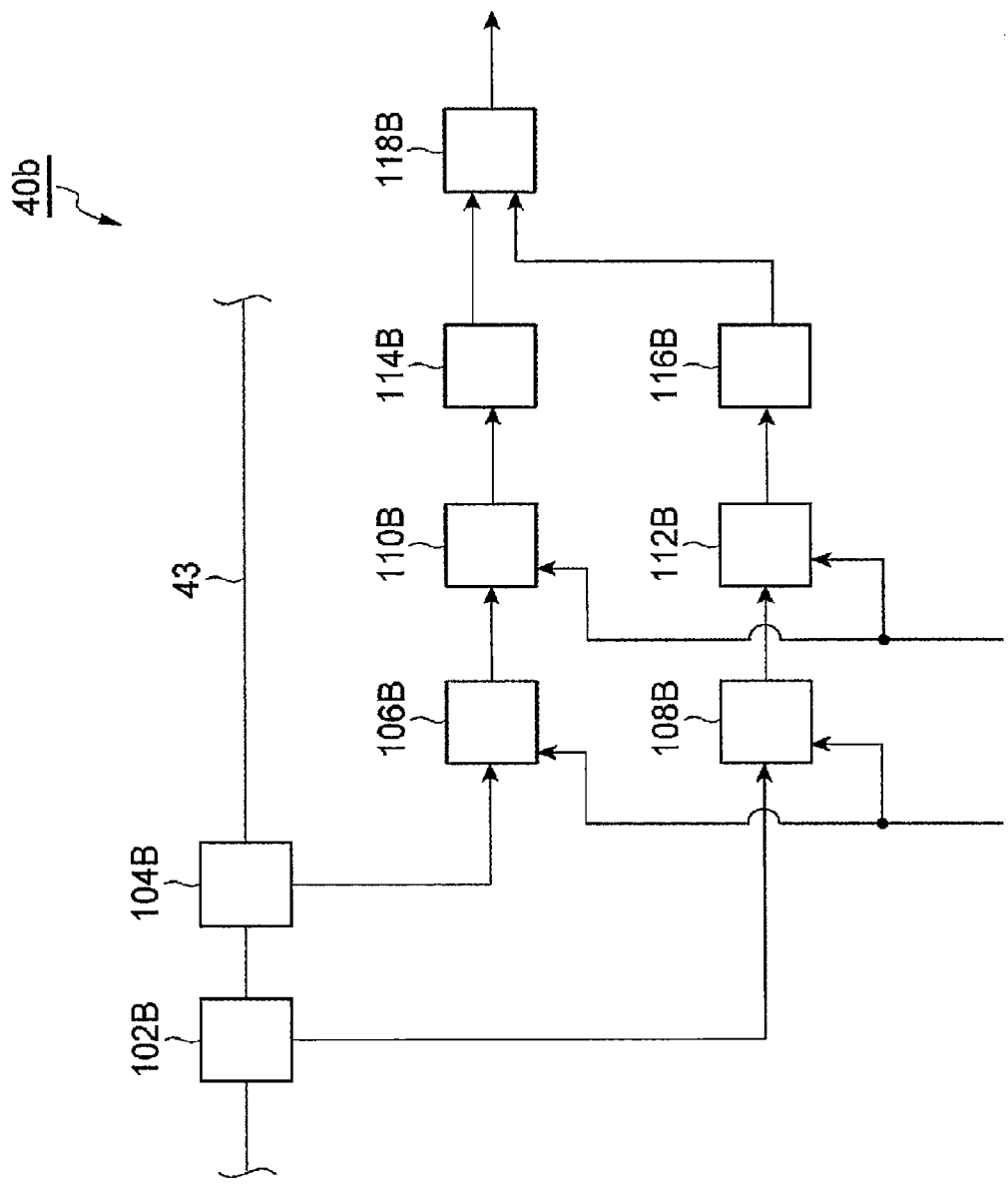
FIG. 7 is a diagram illustrating a configuration of an impedance sensor of the matching device 40.

As depicted in FIG. 7, the impedance sensor 40b is equipped with a current detector 102B, a voltage detector 104B, a filter 106B, a filter 108B, an average value calculator 110B, an average value calculator 112B, a moving average value calculator 114B, a moving average value calculator 116B and an impedance calculator 118B.

The voltage detector 104B detects a voltage waveform of the high frequency power RF1 (modulated high frequency power MRF1 or continuous power CRF1) which is transmitted on the power feed line 43, and outputs a voltage waveform analog signal indicating the corresponding voltage waveform. This voltage waveform analog signal is input to the filter 106B. The filter 106B generates a voltage waveform digital signal by digitizing the voltage waveform analog signal input thereto. Further, the filter 106B receives the frequency specifying signal from the power supply controller 36e and generates a filtered voltage waveform signal by extracting, from the voltage waveform digital signal, a frequency component corresponding to the frequency specified by the frequency specifying signal. Further, the filter 106B may be implemented by, for example, a FPGA (Field Programmable Gate Array).

The filtered voltage waveform signal generated by the filter 106b is output to the average value calculator 110B. Further, a monitoring period designation signal for designating a monitoring period MP1 is input to the average value calculator 110B from the main controller 72. The monitoring period MP1 is set as a preset period except a certain time after the start point of the first period T1 and a certain time before the end point of the first period T1 (see FIG. 12 to FIG. 14). The average value calculator 110B calculates, from the filtered voltage waveform signal, an average value VA21 of the voltages in the monitoring period MP1 within each first period T1. Further, in the second mode, a monitoring period designation signal for designating a monitoring period MP2 may be further input to the average value calculator 110B from the main controller 72. In this case, the average value calculator 110B may calculate an average value VA22 of the voltages in the monitoring period MP2 from the filtered voltage waveform signal. This average value calculator 110B may be implemented by, for example, a FPGA (Field Programmable Gate Array).

The average value VA21 obtained by the average value calculator 110B is output to the moving average value calculator 114B. The moving average value calculator 114B calculates a moving average value VMA21 of, among previously obtained average values VA21, the average values VA21 obtained from the voltages of the high frequency power RF1 in a preset number of most recent monitoring periods MP1. The moving average value VMA21 is output to the impedance calculator 118B. Further, in the second mode, the moving average value calculator 114B may further calculate a moving average value VMA22 of, among previously obtained average values VA22, the average values VA22 obtained from the voltages of the high frequency power RF1 in a preset number of most recent monitoring period MP2. In this case, the moving average value VMA22 is output to the impedance calculator 118B.

The current detector 102B detects a current waveform of the high frequency power RF1 (modulated high frequency power MRF1 or continuous power CRF1) which is transmitted on the power feed line 43, and outputs a current waveform analog signal indicating the corresponding current waveform. This current waveform analog signal is input to the filter 108B. The filter 108B generates a current waveform digital signal by digitizing the current waveform analog signal input thereto. Further, the filter 108B receives the frequency specifying signal from the power supply controller 36e and generates a filtered current waveform signal by extracting, from the current waveform digital signal, a frequency component corresponding to the frequency specified by the frequency specifying signal. The filter 108B may be implemented by, for example, a FPGA (Field Programmable Gate Array).

The filtered current waveform signal generated by the filter 108B is output to the average value calculator 112B. Further, the monitoring period designation signal which designates the monitoring period MP1 is applied to the average value calculator 112B from the main controller 72. The average value calculator 112B calculates, from the filtered current waveform signal, an average value IA21 of the electric currents in the monitoring period MP1 within each first period T1. Further, in the second mode, the monitoring period designation signal which designates the monitoring period MP2 may be further applied to the average value calculator 112B from the main controller 72. In this case, the average value calculator 112B may calculate, from the filtered current waveform signal, an average value IA22 of the electric currents in the monitoring period MP2. This average value calculator 112B may be implemented by, for example, a FPGA (Field Programmable Gate Array).

The average value IA21 obtained by the average value calculator 112B is output to the moving average value calculator 116B. The moving average value calculator 116B calculates a moving average value IMA21 of, among previously obtained average values IA21, the average values IA21 obtained from the electric currents of the high frequency power RF1 in the preset number of most recent monitoring periods MP1. The moving average value IMA21 is output to the impedance calculator 118B. Further, in the second mode, the moving average value calculator 116B may further calculate a moving average value IMA22 of, among previously obtained average values IA22, the average values IA22 obtained from the electric currents of the high frequency power RF1 in a preset number of most recent monitoring periods MP2. In this case, the moving average value IMA22 is output to the impedance calculator 118B.

The impedance calculator 118B calculates, from the moving average value IMA21 and the moving average value VMA21, a moving average value Imp21 of the load impedance of the high frequency power supply 36. This moving average value Imp21 includes an absolute value and a phase component. The moving average value Imp21 obtained by the impedance calculator 118B is output to the matching controller 40c. The matching controller 40c performs the impedance matching by using the moving average value Imp21. To elaborate, the matching controller 40c adjusts the reactance of each of the variable reactance elements 40g and 40h through the actuators 40d and 40e, respectively, such that the load impedance of the high frequency power supply 36 specified by the moving average value Imp21 approximates to the matching point.

Further, the matching controller 40c may adjust the reactance of each of the variable reactance elements 40g and 40h through the actuators 40d and 40e, respectively, such that the aforementioned moving average value Imp12, that is, the moving average value of the load impedance of the high frequency power supply 36 in the preset number of second sub-periods Ts2 approximates to the matching point.

In the exemplary embodiment, in the second mode, the impedance calculator 118B may calculate, from the moving average value IMA22 and the moving average value VMA22, the moving average value Imp22 of the load impedance of the high frequency power supply 36, in addition to the moving average value ImP21. The moving average value Imp22 includes an absolute value and a phase component. The moving average value Imp22 along with the moving average value Imp21 is output to the matching controller 40c. In this case, the matching controller 40c adjusts the reactance of each of the variable reactance elements 40g and 40h through the actuators 40d and 40e such that the load impedance of the high frequency power supply 36 specified by an average value of the moving average value Imp21 and the moving average value Imp22 approximates to the matching point. That is, in this case, a median impedance between the load impedance in the first period T1 and the load impedance in the second period T2 is made to approximate to the matching point by the impedance matching of the matching controller 40c.

After the output of the high frequency power RF1 from the high frequency power supply 36 is started, if the impedance matching is completed, the matching controller 40c applies the completion signal to the power supply controller 36e, as stated above. Further, if the matching controller 40c receives the aforementioned matching control signal from the power supply controller 36e, the matching controller 40c performs the impedance matching to allow the impedance specified by the matching control signal to approximate to the matching point.

Now, reference is made to FIG. 8. As depicted in FIG. 8, according to the exemplary embodiment, the high frequency power supply 38 includes an oscillator 38a, a power amplifier 38b, a power sensor 38c, an impedance sensor 38d and a power supply controller 38e. The power supply controller 38e is made up of a processor such as a CPU, and is configured to control the oscillator 38a, the power amplifier 38b, the power sensor 38c and the impedance sensor 38d by applying control signals to the oscillator 38a, the power amplifier 38b, the power sensor 38c and the impedance sensor 38d with a signal output from the main controller 72, a signal output from a matching controller 42c to be described later, a signal output from the power sensor 38c and a signal output from the impedance sensor 38d.

The signal sent from the main controller 72 to the power supply controller 38e includes a mode designation signal designating any one of the first mode, the second mode and the third mode, a frequency designation signal designating the basic frequency $f_{B2}$, and a modulation designation signal designating the modulation frequency and the duty ratio. Further, in case that the high frequency power supply 38 is operated in the second mode or the third mode as stated above, the signal sent from the main controller 72 to the power supply controller 38e includes a third power designation signal which designates the power of the modulated high frequency power MRF2 in the first period T1 and the power of the modulated high frequency power MRF2 in the second period T2. Further, in case that the high frequency power supply 38 is operated in the aforementioned first mode, the signal sent from the main controller 72 to the power supply controller 38e further includes a fourth power designation signal designating the power of the continuous power CRF2.

The power supply controller 38e applies a frequency control signal for setting the basic frequency $f_{B2}$ designated by the frequency designation signal to the oscillator 38a when starting an output of the high frequency power RF2 from the high frequency power supply 38, that is, the modulated high frequency power MRF2 or the continuous power CRF2. The oscillator 38a receives the frequency control signal from the power supply controller 38e, and outputs the high frequency power of the frequency specified by the corresponding frequency control signal.

Further, after the output of the high frequency power RF2 from the high frequency power supply 38 is started, if the power supply controller 38e receives a completion signal indicating the completion of the impedance matching from the matching device 42, the power supply controller 38e applies, to the oscillator 38a, a frequency control signal for setting the frequency of the high frequency power RF2 in each of the first sub-period Ts1 and the second sub-period Ts2. To elaborate, the power supply controller 38e receives, from the impedance sensor 38*d*, a moving average value Imp31 of the load impedance in the past first sub-periods Ts1 and a moving average value Imp32 of the load impedance in the past second sub-periods Ts2. The moving average value Imp31 and the moving average value Imp32 are updated at a time interval equivalent to an integer multiple of the single cycle Tc, and then, are input to the power supply controller 38*e*. The power supply controller 38*e* outputs, to the oscillator 38*a*, a frequency control signal for setting the frequency of the high frequency power RF2 in each of the first sub-period Ts1 and the second sub-period Ts2 in order to allow the load impedance of the high frequency power supply 38 in the first sub-period Ts1, which is estimated from the moving average value Imp31, and the load impedance of the high frequency power supply 38 in the second sub-period Ts2, which is estimated from the moving average value Imp32, to approximate to the matching point. The oscillator 38*a* sets the frequency of the high frequency power in the first sub-period Ts1 and the frequency of the high frequency power in the second sub-period Ts2 according to the corresponding frequency control signal (see FIG. 18 to FIG. 20).

Further, in case that the modulated high frequency power MRF2 has a power larger than 0 W in the second period T2, the power supply controller 38*e* receives, from the impedance sensor 38*d*, a moving average value Imp33 of the load impedance in the past third sub-periods Ts3 and a moving average value Imp34 of the load impedance in the past fourth sub-periods Ts4. The moving average value Imp33 and the moving average value Imp34 are updated at a time interval equivalent to an integer multiple of the single cycle Tc, and then, are input to the power supply controller 38*e*. The power supply controller 38*e* outputs, to the oscillator 38*a*, a frequency control signal for setting the frequency of the modulated high frequency power MRF2 in each of the third sub-period Ts3 and the fourth sub-period Ts4 in order to allow the load impedance of the high frequency power supply 38 in the third sub-period Ts3 estimated from the moving average value Imp33 and the load impedance of the high frequency power supply 38 in the fourth sub-period Ts4, which is estimated from the moving average value Imp34, to approximate to the matching point. The oscillator 38*a* sets the frequency of the high frequency power in the third sub-period Ts3 and the frequency of the high frequency power in the fourth sub-period Ts4 according to the corresponding frequency control signal (see FIG. 25).

An output of the oscillator 38*a* is connected to an input of the power amplifier 38*b*. The power amplifier 38*b* generates the high frequency power RF2 by amplifying the high frequency power which is output from the oscillator 38*a*, and outputs the generated high frequency power RF2. The power amplifier 38*b* is controlled by the power supply controller 38*e*.

When the output of the high frequency power RF2 is started, if the mode designated by the mode designation signal is either the second mode or the third mode, the power supply controller 38*e* outputs, to the power amplifier 38*b*, a third power control signal for setting the power of the modulated high frequency power MRF2 in each of the first period T1 and the second period T2 according to the modulation designation signal and the third power designation signal from the main controller 72. In the second mode and the third mode, the power amplifier 38*b* amplifies the high frequency power from the oscillator 38*a* according to the third power control signal and outputs the modulated high frequency power MRF2. Meanwhile, when the output of the high frequency power RF2 is started, if the mode specified by the mode designation signal from the main controller 72 is the first mode, the power supply controller 38*e* outputs, to the power amplifier 38*b*, a fourth power control signal for setting the power of the continuous power CRF2 according to the fourth power designation signal from the main controller 72. In the first mode, the power amplifier 38*b* amplifies the high frequency power from the oscillator 38*a* according to the fourth power control signal and outputs the continuous power CRF2.

Further, in the exemplary embodiment, after the output of the modulated high frequency power MRF2 from the high frequency power supply 38 is started, if the power supply controller 38*e* receives a completion signal indicating the completion of the impedance matching from the matching device 42, the power supply controller 38*e* determines whether the moving average value Imp31 and the moving average value Imp32 are within a range (adjustable range) where they can be matched with the matching point by adjusting the frequency of the modulated high frequency power MRF2. If at least one of the moving average value Imp31 and the moving average value Imp32 is out of the adjustable range, the power supply controller 38*e* outputs, to the matching device 42, a matching control signal for allowing a median impedance between the load impedance of the high frequency power supply 38, which is estimated from the moving average value Imp31, and the load impedance of the high frequency power supply 38, which is estimated from the moving average value Imp32, to approximate to the matching point. That is, the power supply controller 38*e* outputs, to the matching device 42, a matching control signal for allowing a median impedance between the load impedance of the high frequency power supply 38 in the first sub-period Ts1 and the load impedance of the high frequency power supply 38 in the second sub-period Ts2 to approximate to the matching point.

Alternatively, in case that at least one of the moving average value Imp31 and the moving average value Imp32 is out of the adjustable range, the power supply controller 38*e* outputs, to the matching device 42, a matching control signal for allowing the load impedance of the high frequency power supply 38, which is estimated from the moving average value Imp32, to approximate to the matching point. That is, the power supply controller 38*e* outputs, to the matching device 42, a matching control signal for allowing the load impedance of the high frequency power supply 38 in the second sub-period Ts2 to approximate to the matching point. If it is determined that the load impedance of the high frequency power supply 38 in the first sub-period Ts1 is out of the adjustable range, the power supply controller 38*e* outputs, to the power amplifier 38*b*, a power control signal for setting the power of the modulated high frequency power MRF2 in the first sub-period Ts1 to be higher than that in the second sub-period Ts2. The power amplifier 38*b* adjusts the power of the modulated high frequency power MRF2 in the first sub-period Ts1 and the power of the modulated high frequency power MRF2 in the second sub-period Ts2 according to the corresponding power control signal (see FIG. 23).

Further, if the modulated high frequency power MRF2 has a power larger than 0 W in the second period T2, the power supply controller 38*e* may output, to the power amplifier 38*b*, a power control signal for setting the power of the modulated high frequency power MRF2 in the third sub-period Ts3 to be higher than that in the fourth sub-period Ts4. In this case, the power amplifier 38*b* adjusts the power of the modulated high frequency power MRF2 in the third sub-period Ts3 and the power of the modulated high frequency power MRF2 in the fourth sub-period Ts4 according to the corresponding power control signal (see FIG. 25).

The power sensor 38c is provided at a rear end of the power amplifier 38b. The power sensor 38c includes a directional coupler, a progressive wave power detector and a reflection wave power detector. The directional coupler outputs a part of a progressive wave of the high frequency power RF2 to the progressive wave power detector, and outputs a reflection wave thereof to the reflection wave power detector. A frequency specifying signal for specifying a set frequency of the high frequency power RF2 is applied to the power sensor 38c from the power supply controller 38e. The progressive wave power detector generates a measurement value of a power of a component of the set frequency specified by the frequency specifying signal among all frequency components of the progressive wave, that is, a progressive wave power measurement value. This progressive wave power measurement value is applied to the power supply controller 38e for power feedback.

The frequency specifying signal is also sent to the reflection wave power detector from the power supply controller 38e. The reflection wave power detector generates a measurement value of a power of a component of the set frequency specified by the frequency specifying signal among all frequency components of the reflection wave, that is, a reflection wave power measurement value PR21, and also generates a measurement value of a total power of all the frequency components of the reflection wave, that is, a reflection wave power measurement value PR22. The reflection wave power measurement value PR21 is applied to the main controller 72 to be displayed on the monitor. Further, the reflection wave power measurement value PR21 may be used in the power supply controller 38e to set the first sub-period Ts1 and the second sub-period Ts2. Furthermore, the reflection wave power measurement value PR21 may be used in the power supply controller 38e to set the third sub-period Ts3 and the fourth sub-period Ts4. Moreover, the reflection wave power measurement value PR22 is sent to the power supply controller 38e to protect the power amplifier 38b.

The impedance sensor 38d calculates a moving average value Imp31 of the load impedance of the high frequency power supply 38 in a preset number of most recent first sub-periods Ts1, and also calculates a moving average value Imp32 of the load impedance of the high frequency power supply 38 in a preset number of most recent second sub-periods Ts2.

In the exemplary embodiment, the power supply controller 38e has a table in which the time lengths of the first sub-period Ts1 and the second sub-period Ts2 are stored in relation to the modulation frequency and the duty ratio of the modulated high frequency power. By referring to the table, the power supply controller 38e outputs a sub-period specifying signal for specifying the first sub-period Ts1 and the second sub-period Ts2 to the impedance sensor 38d. Further, a time length of the third sub-period Ts3 and a time length of the fourth sub-period Ts4 may also be stored in the aforementioned table in relation to the modulation frequency and the duty ratio of the modulated high frequency power. By referring to this table, the power supply controller 38e may output a sub-period specifying signal for specifying the third sub-period Ts3 and the fourth sub-period Ts4 to the impedance sensor 38d. This corresponding table of the power supply controller 38e may be commonly shared with the table of the power supply controller 36e.

In another exemplary embodiment, based on time series data of the aforementioned reflection wave power measurement value PR21, the power supply controller 38e may set a period in which the reflection wave power measurement value PR21 is stabilized to or below a preset value in each first period T1 as a second sub-period Ts2, and sets a period prior to the second sub-period Ts2 within each first period T1 as a first sub-period Ts1. In this case as well, the power supply controller 38e outputs a sub-period specifying signal for specifying the first sub-period Ts1 and the second sub-period Ts2 to the impedance sensor 38d. Further, based on the time series data of the reflection wave power measurement value PR21, the power supply controller 38e may set a period in which the reflection wave power measurement value PR21 is stabilized to or below a preset value in each second period T2 as a fourth sub-period Ts4, and sets a period prior to the fourth sub-period Ts4 within each second period T2 as a third sub-period Ts3. In this case as well, the power supply controller 38e outputs a sub-period specifying signal for specifying the third sub-period Ts3 and the fourth sub-period Ts4 to the impedance sensor 38d.

As shown in FIG. 9, in the exemplary embodiment, the impedance sensor 38d includes a current detector 102C, a voltage detector 104C, a filter 106C, a filter 108C, an average value calculator 110C, an average value calculator 112C, a moving average value calculator 114C, a moving average value calculator 116C and an impedance calculator 118C.

The voltage detector 104C detects a voltage waveform of the high frequency power RF2 (modulated high frequency power MRF2 or continuous power CRF2) which is transmitted on the power feed line 45, and outputs a voltage waveform analog signal indicating the corresponding voltage waveform. This voltage waveform analog signal is input to the filter 106C. The filter 106C generates a voltage waveform digital signal by digitizing the voltage waveform analog signal input thereto. Further, the filter 106C receives the frequency specifying signal from the power supply controller 38e, and generates a filtered voltage waveform signal by extracting, from the voltage waveform digital signal, a frequency component corresponding to the frequency specified by the frequency specifying signal. Further, the filter 106C may be implemented by, for example, a FPGA (Field Programmable Gate Array).

The filtered voltage waveform signal generated by the filter 106C is output to the average value calculator 110C. Further, the sub-period specifying signal from the power supply controller 38e is also input to the average value calculator 110C. The average value calculator 110C calculates, from the filtered voltage waveform signal, an average value VA31 of the voltages in the first sub-period Ts1 within each first period T1, which is specified by the sub-period specifying signal. Further, the average value calculator 110C also calculates, from the filtered voltage waveform signal, an average value VA32 of the voltages in the second sub-period Ts2 within each first period T1, which is specified by the sub-period specifying signal.

Further, the average value calculator 110C may calculate, from the filtered voltage waveform signal, an average value VA33 of the voltages in the third sub-period Ts3 within each second period T2, which is specified by the sub-period specifying signal. Further, the average value calculator 110C may calculate, from the filtered voltage waveform signal, an average value VA34 of the voltages in the fourth sub-period Ts4 within each second period T2, which is specified by the sub-period specifying signal. Further, the average value calculator 110C may be implemented by, for example, a FPGA (Field Programmable Gate Array).

The average value VA31 and the average value VA32 obtained by the average value calculator 110C are output to the moving average value calculator 114C. The moving average value calculator 114C calculates a moving average value VMA31 of, among previously obtained average values VA31, the average values VA31 obtained from the voltages of the high frequency power RF2 in the preset number of most recent first sub-periods Ts1. Further, the moving average value calculator 114C calculates a moving average value VMA32 of, among previously obtained average values VA32, the average values VA32 obtained from the voltages of the high frequency power RF2 in the preset number of most recent second sub-periods Ts2. The moving average values VMA31 and VMA32 obtained by the moving average value calculator 114C are output to the impedance calculator 118C.

Further, the moving average value calculator 114C may calculate a moving average value VMA33 of, among previously obtained average values VA33, the average values VA33 obtained from the voltages of the high frequency power RF2 in a preset number of most recent third sub-periods Ts3. Further, the moving average value calculator 114C may calculate a moving average value VMA34 of, among previously obtained average values VA34, the average values VA34 obtained from the voltages of the high frequency power RF2 in a preset number of most recent fourth sub-periods Ts4. The moving average values VMA33 and VMA34 obtained by the moving average value calculator 114C are output to the impedance calculator 118C. The moving average value calculator 114C may be implemented by, for example, a CPU. Alternatively, the moving average value calculator 114C may be implemented by a FPGA (Field Programmable Gate Array).

The current detector 102C detects a current waveform of the high frequency power RF2 (modulated high frequency power MRF2 or continuous power CRF2) which is transmitted on the power feed line 45, and outputs a current waveform analog signal indicating the corresponding current waveform. This current waveform analog signal is input to the filter 108C. The filter 108C generates a current waveform digital signal by digitizing the current waveform analog signal input thereto. Further, the filter 108C receives the frequency specifying signal from the power supply controller 38e and generates a filtered current waveform signal by extracting, from the current waveform digital signal, a frequency component corresponding to the frequency specified by the frequency specifying signal. Further, the filter 108C may be implemented by, for example, a FPGA (Field Programmable Gate Array).

The filtered current waveform signal generated by the filter 108C is output to the average value calculator 112C. Further, the sub-period specifying signal from the power supply controller 38e is also applied to the average value calculator 112C. The average value calculator 112C calculates, from the filtered current waveform signal, an average value IA31 of the electric currents in the first sub-period Ts1 within each first period T1, which is specified by the sub-period specifying signal. Further, the average value calculator 112C also calculates, from the filtered current waveform signal, an average value IA32 of the electric currents in the second sub-period Ts2 within each first period T1, which is specified by the sub-period specifying signal.

Further, the average value calculator 112C may calculate, from the filtered current waveform signal, an average value IA33 of the electric currents in the third sub-period Ts3 within each second period T2, which is specified by the sub-period specifying signal. Further, the average value calculator 112C may calculate, from the filtered current waveform signal, an average value IA34 of the electric currents in the fourth sub-period Ts4 within each second period T2, which is specified by the sub-period specifying signal. Further, the average value calculator 112C may be implemented by, for example, a FPGA (Field Programmable Gate Array).

The average value IA31 and the average value IA32 obtained by the average value calculator 112C are output to the moving average value calculator 116C. The moving average value calculator 116C calculates a moving average value IMA31 of, among previously obtained average values IA31, the average values IA31 obtained from the electric currents of the high frequency power RF2 in the preset number of most recent first sub-periods Ts1. Further, the moving average value calculator 116C calculates a moving average value IMA32 of, among previously obtained average values IA32, the average values IA32 obtained from the electric currents of the high frequency power RF2 in the preset number of most recent second sub-periods Ts2. The moving average value calculator 116C may be implemented by, by way of non-limiting example, a CPU. Alternatively, the moving average value calculator 116C may be implemented by a FPGA (Field Programmable Gate Array). The moving average values IMA31 and IMA32 obtained by the moving average value calculator 116C are output to the impedance calculator 118C.

Further, the moving average value calculator 116C may calculate a moving average value IMA33 of, among previously obtained average values IA33, the average values IA33 obtained from the electric currents of the high frequency power RF2 in the preset number of most recent third sub-periods Ts3. Further, the moving average value calculator 116C may calculate a moving average value IMA34 of, among previously obtained average values IA34, the average values IA34 obtained from the electric currents of the high frequency power RF2 in the preset number of most recent fourth sub-periods Ts4. The moving average values IMA33 and IMA34 obtained by the moving average value calculator 116C are output to the impedance calculator 118C. The moving average value calculator 116C may be implemented by, for example, a CPU. Alternatively, the moving average value calculator 116C may be implemented by a FPGA (Field Programmable Gate Array).

The impedance calculator 118C calculates, from the moving average value IMA31 and the moving average value VMA31, a moving average value Imp31 of the load impedance of the high frequency power supply 38 in the preset number of most recent first sub-periods Ts1. This moving average value Imp31 includes an absolute value and a phase component. Further, the impedance calculator 118C calculates, from the moving average value IMA32 and the moving average value VMA32, a moving average value Imp32 of the load impedance of the high frequency power supply 38 in the preset number of most recent second sub-periods Ts2. This moving average value Imp32 includes an absolute value and a phase component. The moving average values Imp31 and Imp32 obtained by the impedance calculator 118C are output to the power supply controller 38e. The moving average values Imp31 and Imp32 are used to set the frequency of the high frequency power RF2 in the power supply controller 38e, as stated above.

Further, in the exemplary embodiment, the impedance calculator 118C may calculate, from the moving average value IMA33 and the moving average value VMA33, a moving average value Imp33 of the load impedance of the high frequency power supply 38 in the preset number of most recent third sub-periods Ts3. This moving average value Imp33 includes an absolute value and a phase component. Further, the impedance calculator 118C may calculate, from the moving average value IMA34 and the moving average value VMA34, a moving average value Imp34 of the load impedance of the high frequency power supply 38 in the preset number of most recent fourth sub-periods Ts4. This moving average value Imp34 includes an absolute value and a phase component. The moving average values Imp33 and Imp34 obtained by the impedance calculator 118C are output to the power supply controller 38e. The moving average values Imp33 and Imp34 may be used to set the frequency of the high frequency power RF2 in the power supply controller 38e, as stated above.

Referring back to FIG. 8, the matching device 42 is equipped with a matching circuit 42a, an impedance sensor 42b, a matching controller 42c and actuators 42d and 42e. The matching circuit 42a includes variable reactance elements 42g and 42h. The variable reactance elements 42g and 42h may be, for example, variable capacitors. Further, the matching circuit 42a may further include an inductor or the like.

The matching controller 42c is operated under the control of the main controller 72, and is configured to adjust a reactance of each of the variable reactance elements 42g and 42h by controlling the actuators 42d and 42e according to a measurement value of the load impedance output from the impedance sensor 42b such that the load impedance approximates to the matching point. The actuators 42d and 42e may be, by way of non-limiting example, motors.

Figure 10:
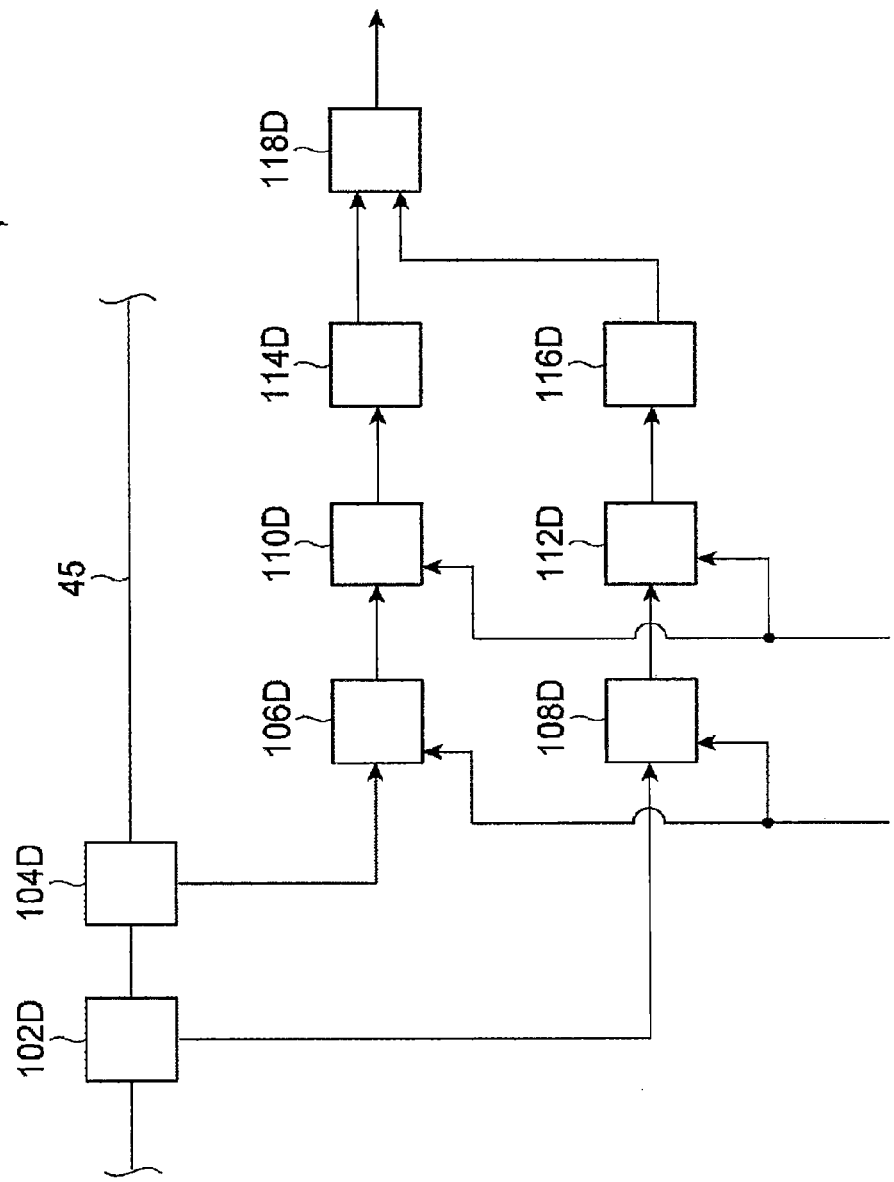
FIG. 10 is a diagram illustrating a configuration of an impedance sensor of the matching device 42.

As depicted in FIG. 10, the impedance sensor 42b is equipped with a current detector 102D, a voltage detector 104D, a filter 106D, a filter 108D, an average value calculator 110D, an average value calculator 112D, a moving average value calculator 114D, a moving average value calculator 116D and an impedance calculator 118D.

The voltage detector 104D detects a voltage waveform of the high frequency power RF2 (modulated high frequency power MRF2 or continuous power CRF2) which is transmitted on the power feed line 45, and outputs a voltage waveform analog signal indicating the corresponding voltage waveform. This voltage waveform analog signal is input to the filter 106D. The filter 106D generates a voltage waveform digital signal by digitizing the voltage waveform analog signal input thereto. Further, the filter 106D receives the frequency specifying signal from the power supply controller 38e, and generates a filtered voltage waveform signal by extracting, from the voltage waveform digital signal, a frequency component corresponding to the frequency specified by the frequency specifying signal. Further, the filter 106D may be implemented by, for example, a FPGA (Field Programmable Gate Array).

The filtered voltage waveform signal generated by the filter 106D is output to the average value calculator 110D. Further, a monitoring period designation signal which designates a monitoring period MP1 is input to the average value calculator 110D from the main controller 72. The average value calculator 110D calculates, from the filtered voltage waveform signal, an average value VA41 of the voltages in the monitoring period MP1 within each first period T1. Further, in the first mode, a monitoring period designation signal for designating a monitoring period MP2 may be further input to the average value calculator 110D from the main controller 72. In this case, the average value calculator 110D may calculate an average value VA42 of the voltages in the monitoring period MP2 from the filtered voltage waveform signal. This average value calculator 110D may be implemented by, for example, a FPGA (Field Programmable Gate Array).

The average value VA41 obtained by the average value calculator 110D is output to the moving average value calculator 114D. The moving average value calculator 114D calculates a moving average value VMA41 of, among previously obtained average values VA41, the average values VA41 obtained from the voltages of the high frequency power RF2 in a preset number of most recent monitoring periods MP1. The moving average value VMA41 is output to the impedance calculator 118D. Further, in the first mode, the moving average value calculator 114D may further calculate a moving average value VMA42 of, among previously obtained average values VA42, the average values VA42 obtained from the voltages of the high frequency power RF2 in a preset number of most recent monitoring period MP2. In this case, the moving average value VMA42 is output to the impedance calculator 118D.

The current detector 102D detects a current waveform of the high frequency power RF2 (modulated high frequency power MRF2 or continuous power CRF2) which is transmitted on the power feed line 45, and outputs a current waveform analog signal indicating the corresponding current waveform. This current waveform analog signal is input to the filter 108D. The filter 108D generates a current waveform digital signal by digitizing the current waveform analog signal input thereto. Further, the filter 108D receives the frequency specifying signal from the power supply controller 38e, and generates a filtered current waveform signal by extracting, from the current waveform digital signal, a frequency component corresponding to the frequency specified by the frequency specifying signal. The filter 108D may be implemented by, for example, a FPGA (Field Programmable Gate Array).

The filtered current waveform signal generated by the filter 108D is output to the average value calculator 112D. Further, the monitoring period designation signal which designates the monitoring period MP1 is applied to the average value calculator 112D from the main controller 72. The average value calculator 112D calculates, from the filtered current waveform signal, an average value IA41 of the electric currents in the monitoring period MP1 within each first period T1. Further, in the first mode, the monitoring period designation signal which designates the monitoring period MP2 may be further applied to the average value calculator 112D from the main controller 72. In this case, the average value calculator 112D may calculate, from the filtered current waveform signal, an average value IA42 of the electric currents in the monitoring period MP2. This average value calculator 112D may be implemented by, for example, a FPGA (Field Programmable Gate Array).

The average value IA41 obtained by the average value calculator 112D is output to the moving average value calculator 116D. The moving average value calculator 116D calculates a moving average value IMA41 of, among previously obtained average values IA41, the average values IA41 obtained from the electric currents of the high frequency power RF2 in a preset number of most recent monitoring periods MP1. The moving average value IMA41 is output to the impedance calculator 118D. Further, in the first mode, the moving average value calculator 116D may further calculate a moving average value IMA42 of, among previously obtained average values IA42, the average values IA42 obtained from the electric currents of the high frequency power RF2 in a preset number of most recent monitoring periods MP2. In this case, the moving average value IMA42 is output to the impedance calculator 118D.

The impedance calculator 118D calculates, from the moving average value IMA41 and the moving average value VMA41, a moving average value Imp41 of the load impedance of the high frequency power supply 38. This moving average value Imp41 includes an absolute value and a phase component. The moving average value Imp41 obtained by the impedance calculator 118D is output to the matching controller 42c. The matching controller 42c performs the impedance matching by using the moving average value Imp41. To elaborate, the matching controller 42c adjusts the reactance of each of the variable reactance elements 42g and 42h through the actuators 42d and 42e, respectively, such that the load impedance of the high frequency power supply 38 specified by the moving average value Imp41 approximates to the matching point.

Further, the matching controller 42c may adjust the reactance of each of the variable reactance elements 42g and 42h through the actuators 42d and 42e, respectively, such that the aforementioned moving average value Imp32, that is, the moving average value of the load impedance of the high frequency power supply 38 in the preset number of second sub-periods Ts2 approximates to the matching point.

In the exemplary embodiment, in the second mode, the impedance calculator 118D may calculate, from the moving average value IMA42 and the moving average value VMA42, the moving average value Imp42 of the load impedance of the high frequency power supply 38, in addition to the moving average value Imp41. The moving average value Imp42 includes an absolute value and a phase component. The moving average value Imp42 along with the moving average value Imp41 is output to the matching controller 42c. In this case, the matching controller 42c adjusts the reactance of each of the variable reactance elements 42g and 42h through the actuators 42d and 42e such that the load impedance of the high frequency power supply 38 specified by an average value of the moving average value Imp41 and the moving average value Imp42 approximates to the matching point. That is, in this case, a median impedance between the load impedance in the first period T1 and the load impedance in the second period T2 is made to approximate to the matching point by the impedance matching of the matching controller 42c.

After the output of the high frequency power RF2 from the high frequency power supply 38 is started, if the impedance matching is completed, the matching controller 42c applies the completion signal to the power supply controller 38e, as stated above. Further, if the matching controller 42c receives the aforementioned matching control signal from the power supply controller 38e, the matching controller 42c performs the impedance matching such that the impedance specified by the matching control signal approximates to the matching point.

Figure 12:
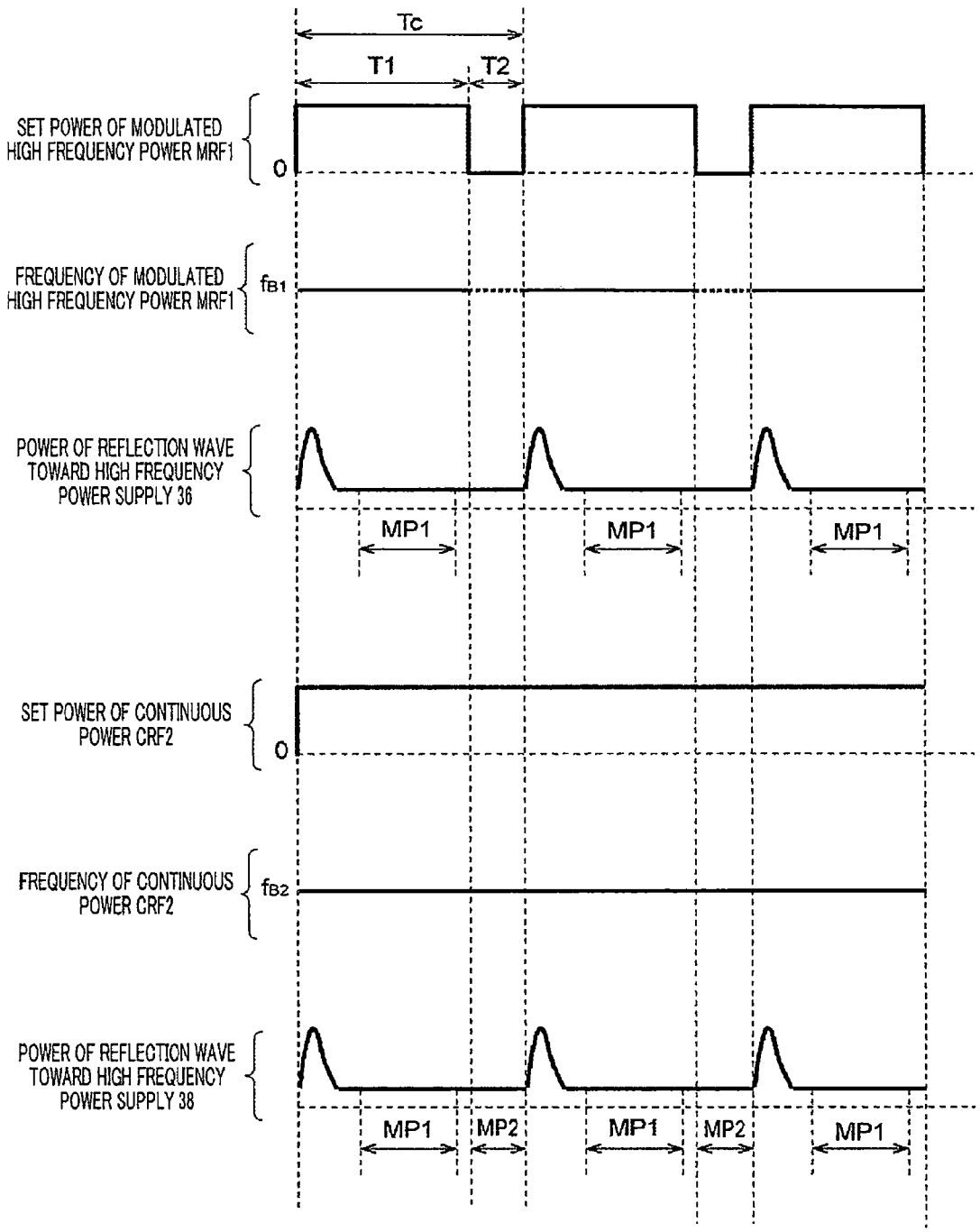
FIG. 12 illustrates timing charts before the impedance matching by the matching device is performed in a case where the first mode is selected.
Figure 13:
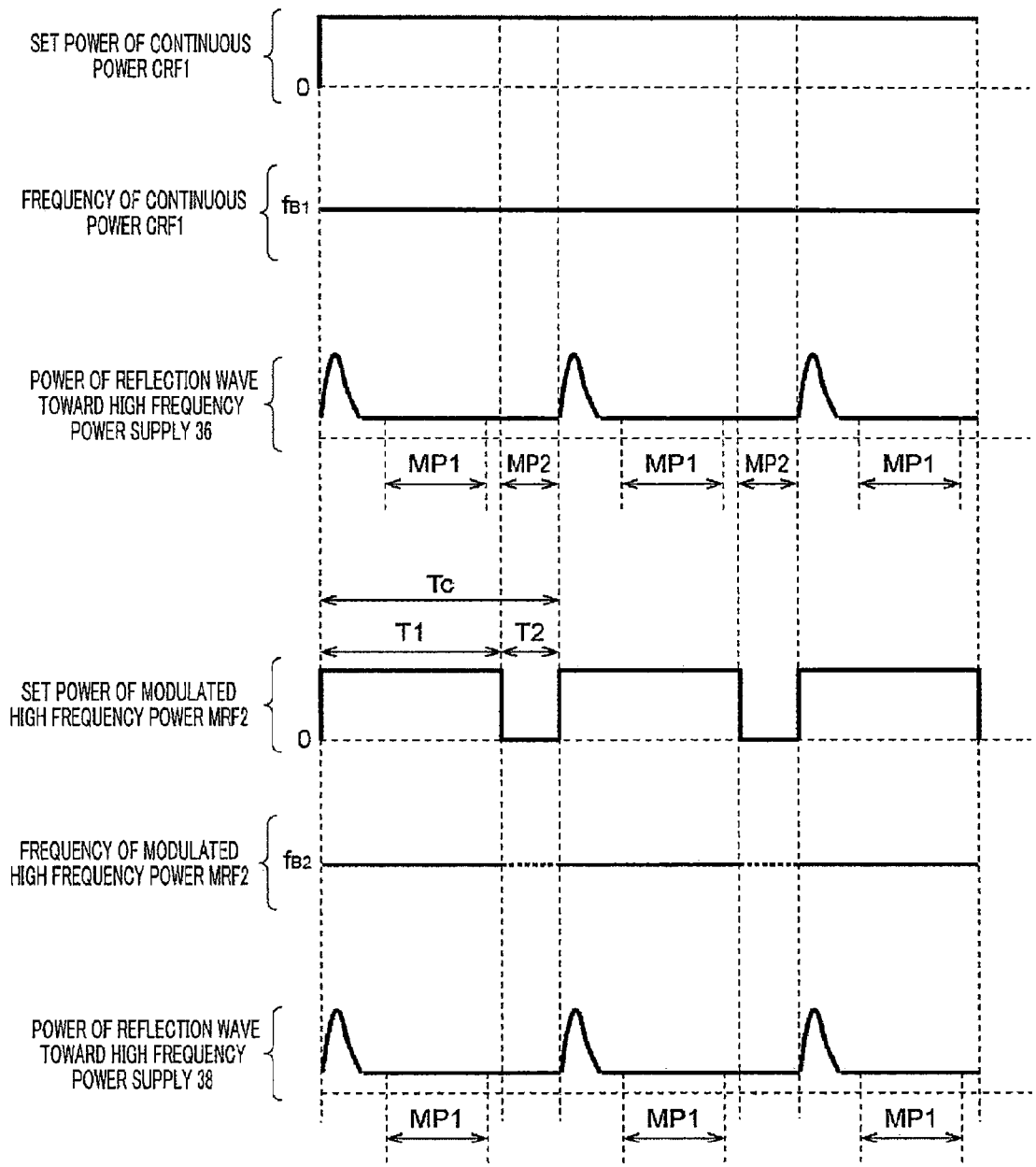
FIG. 13 illustrates timing charts before the impedance matching by the matching device is performed in a case where the second mode is selected.
Figure 14:
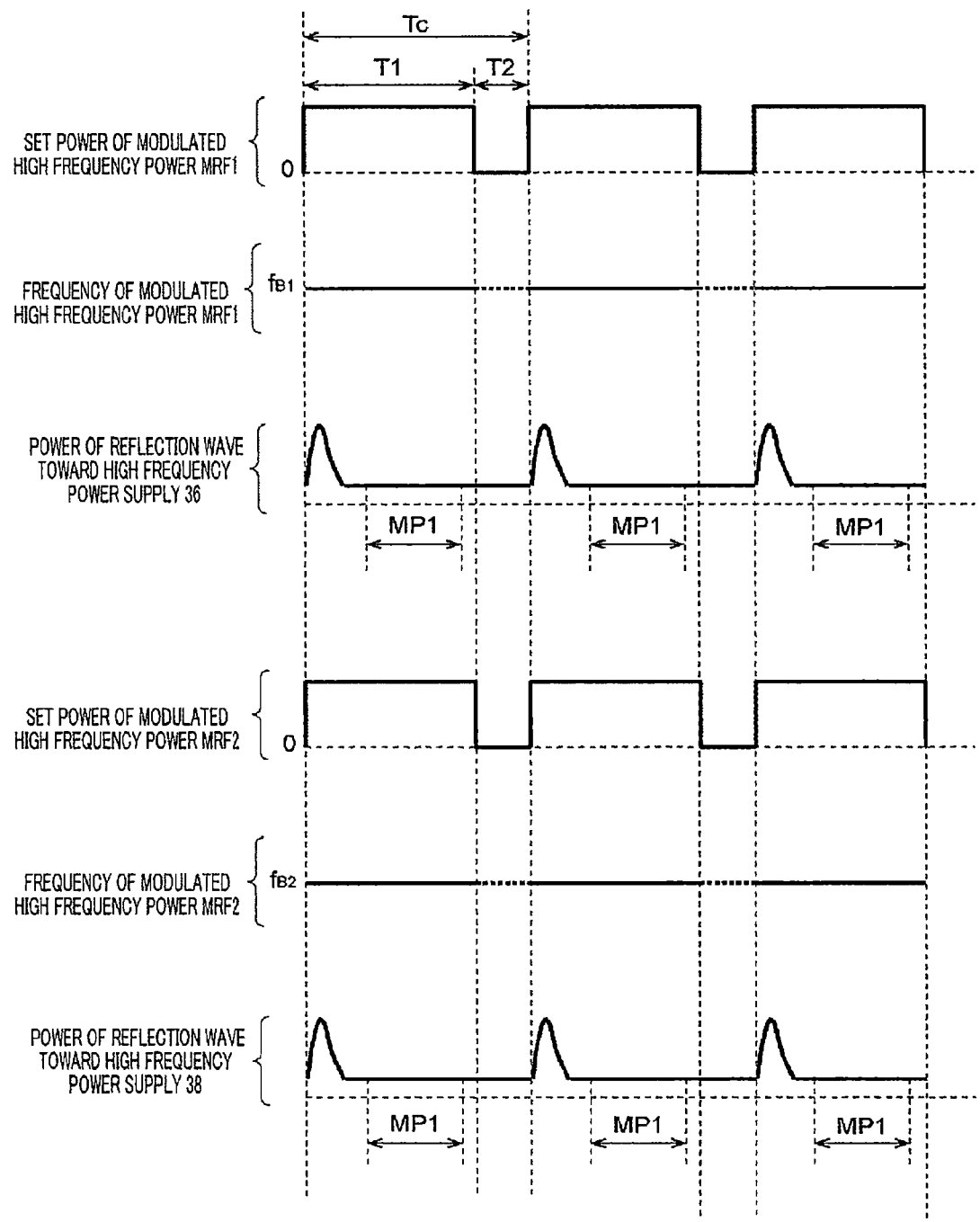
FIG. 14 illustrates timing charts before the impedance matching by the matching device is performed in a case where the third mode is selected.
Figure 15:
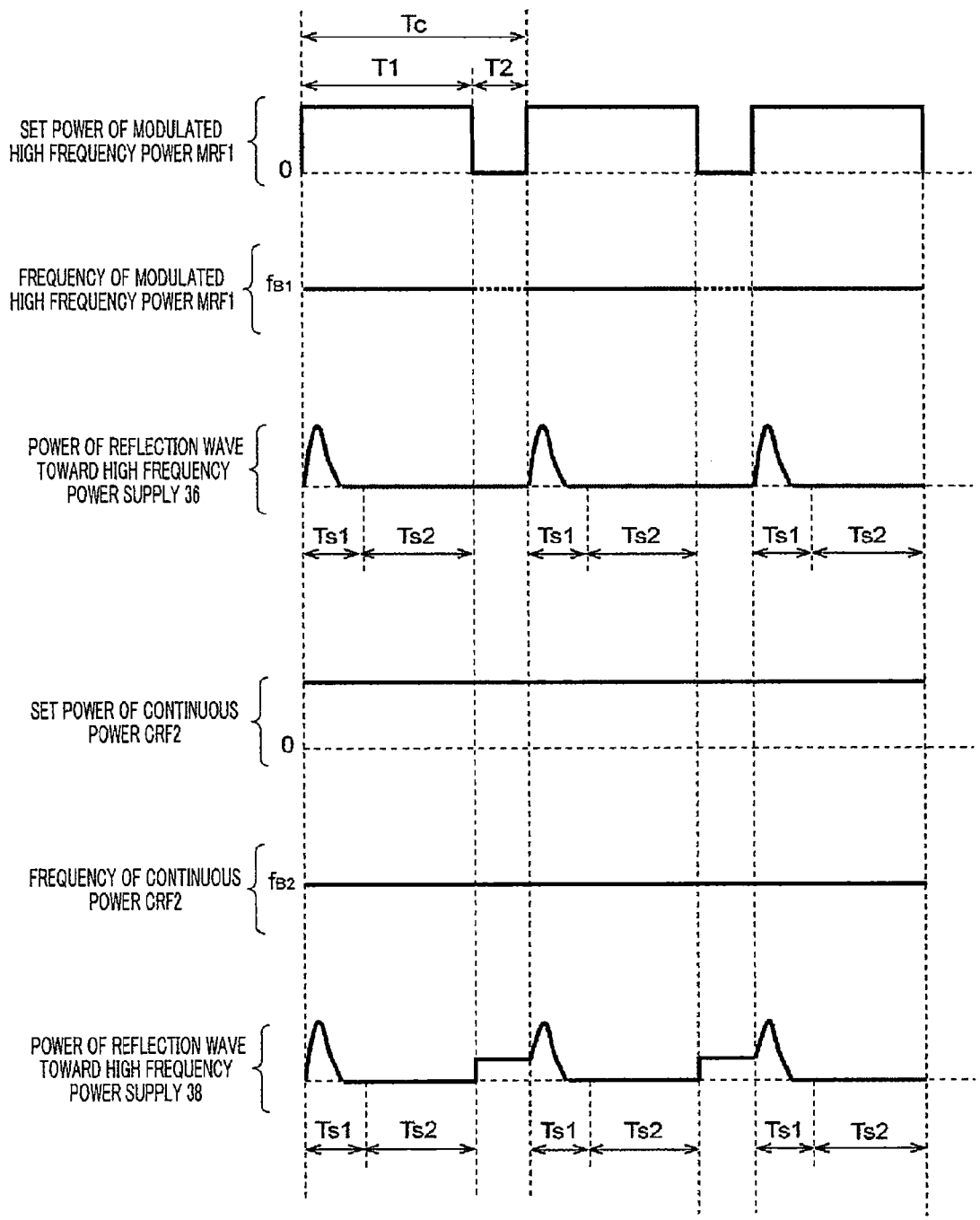
FIG. 15 illustrates timing charts after the impedance matching by the matching device is performed in a case where the first mode is selected.
Figure 16:
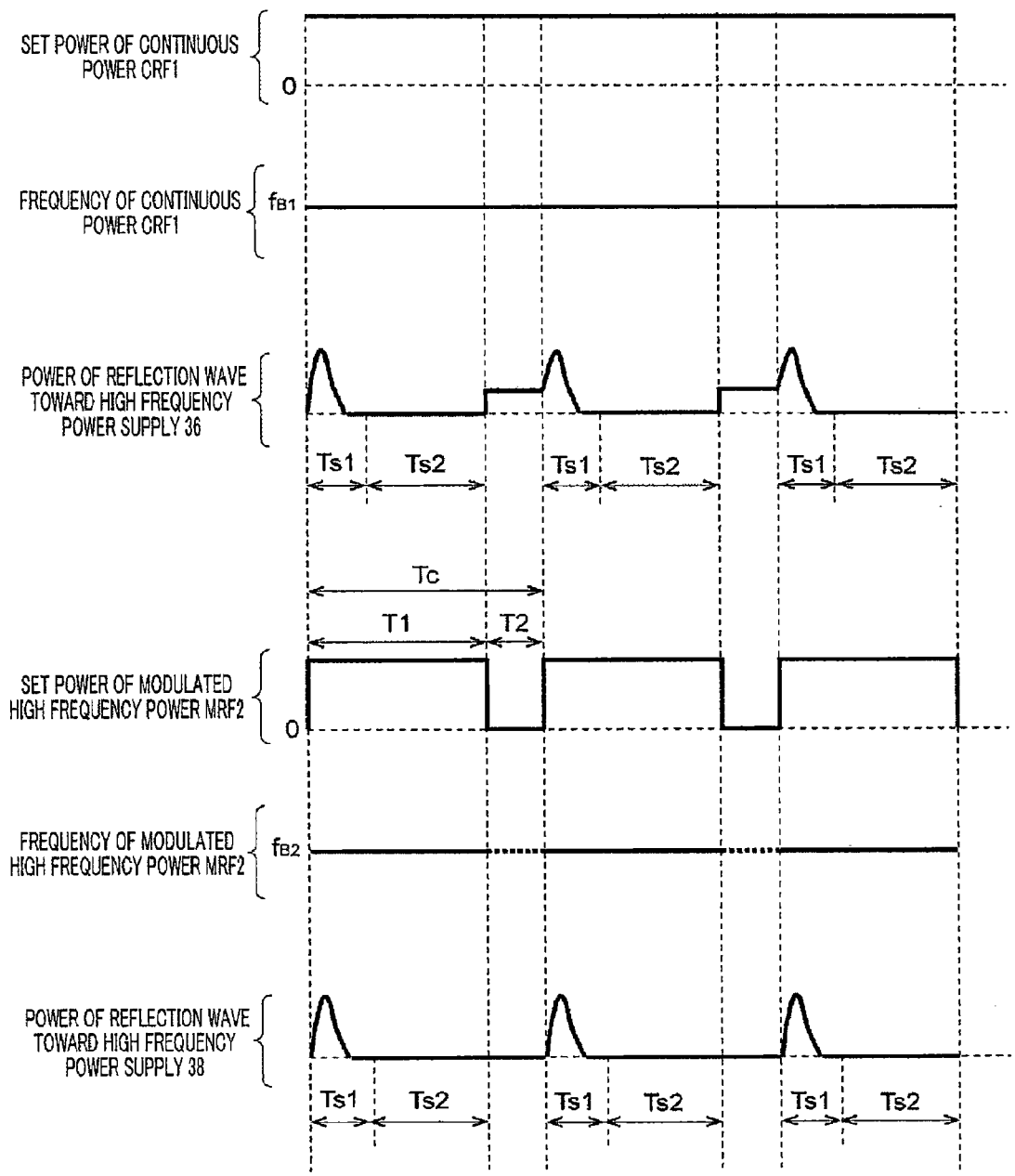
FIG. 16 illustrates timing charts after the impedance matching by the matching device is performed in a case where the second mode is selected.
Figure 17:
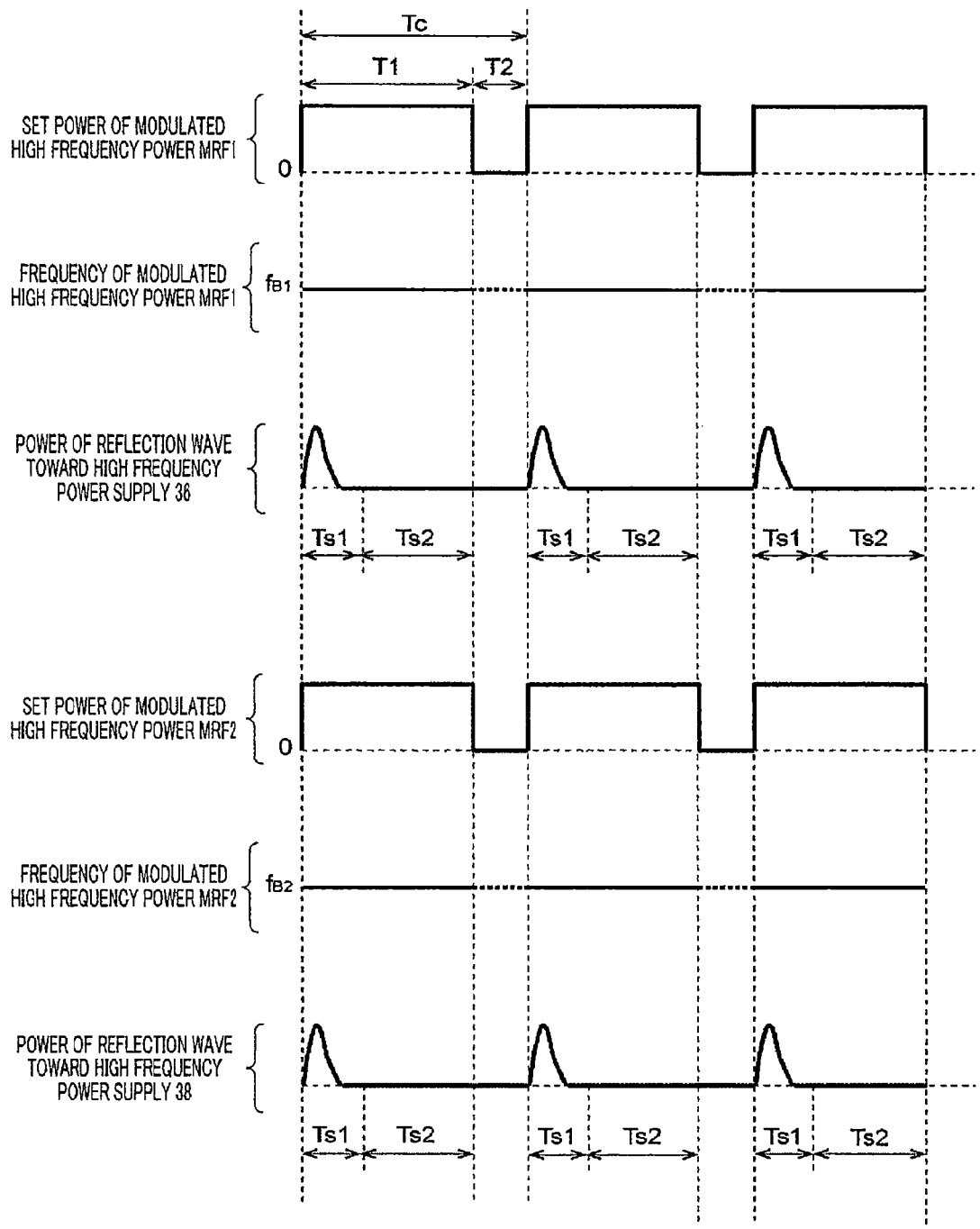
FIG. 17 illustrates timing charts after the impedance matching by the matching device is performed in a case where the third mode is selected.
Figure 18:
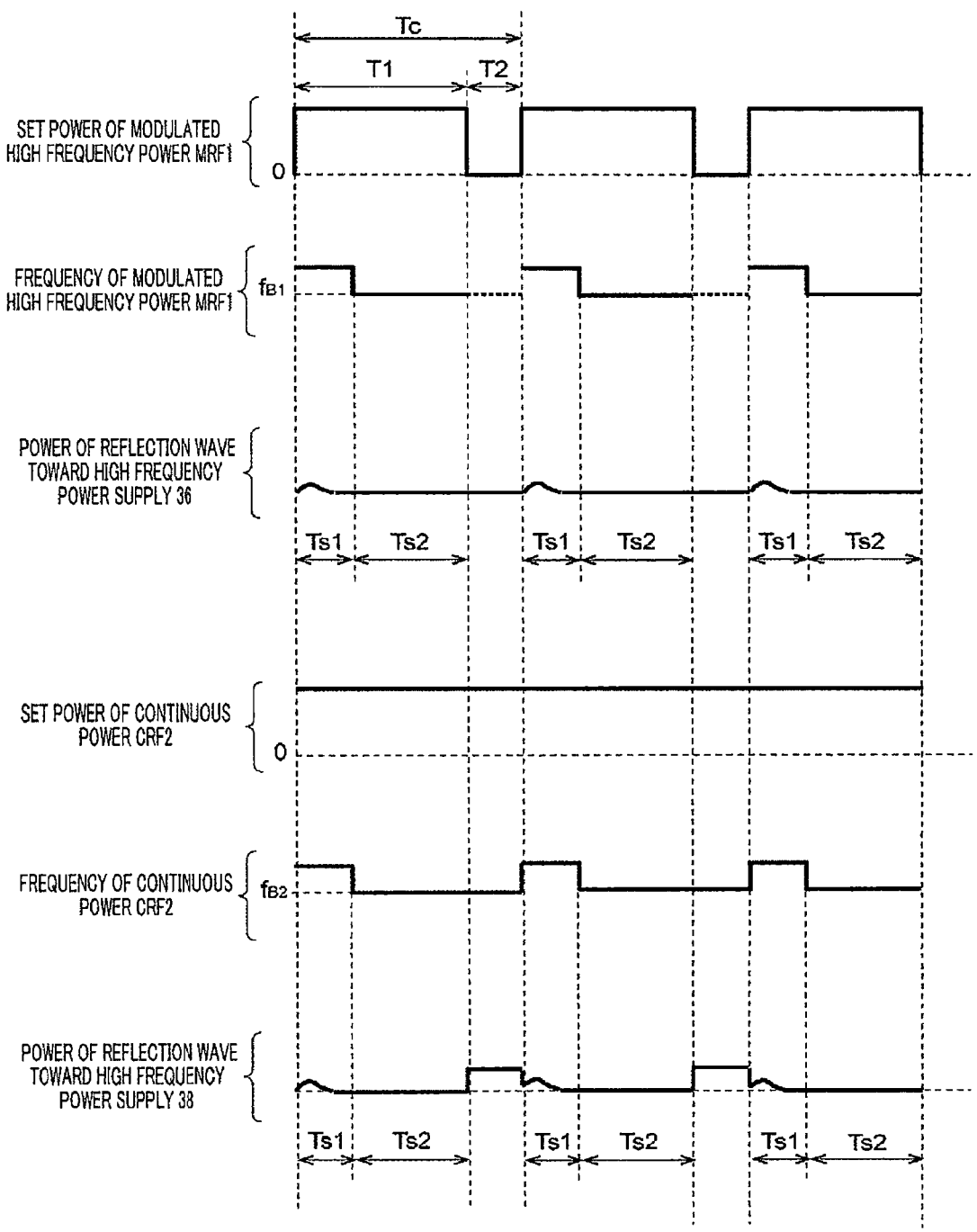
FIG. 18 illustrates timing charts after a frequency of a high frequency power is adjusted in a case where the first mode is selected.
Figure 19:
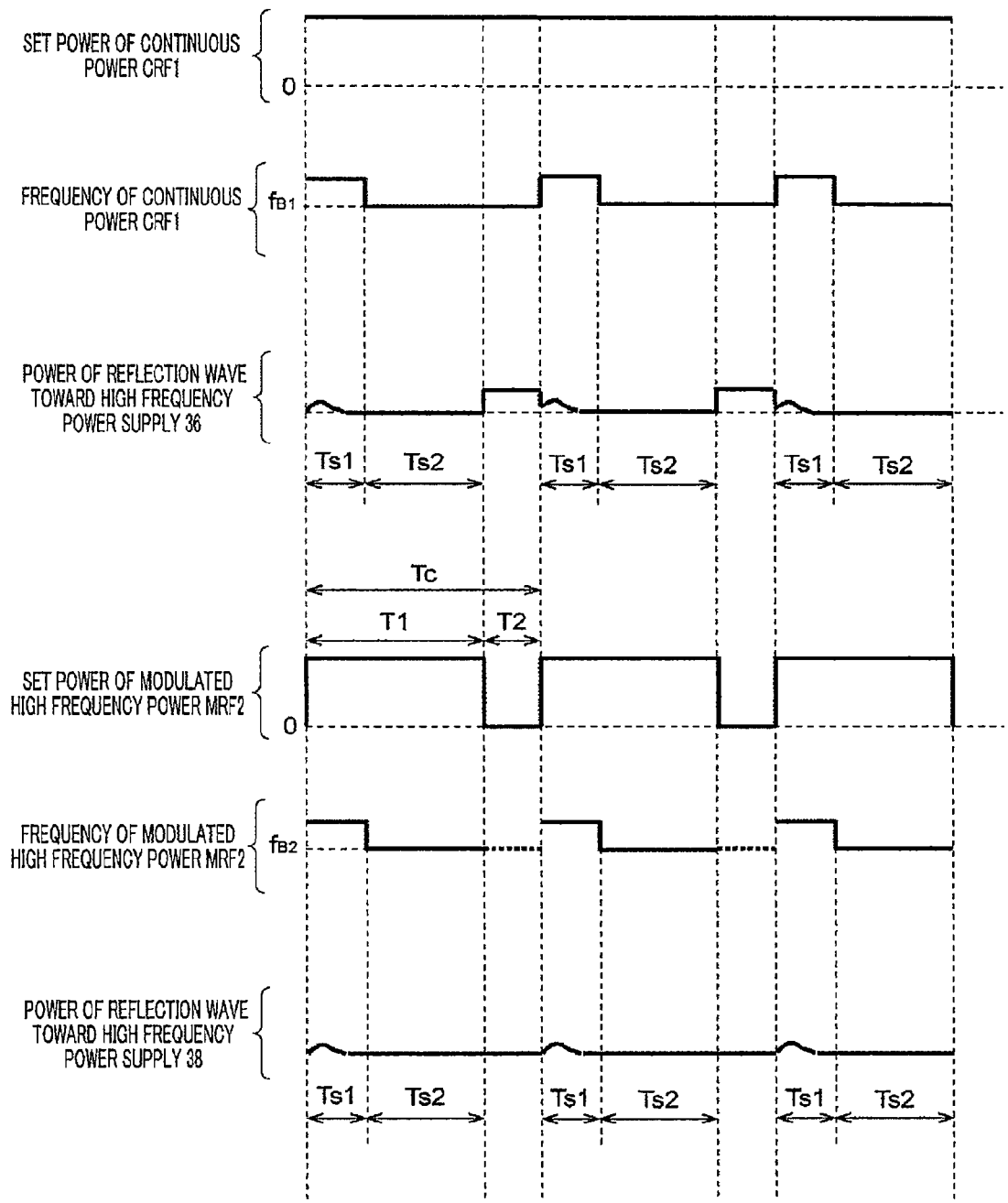
FIG. 19 illustrates timing charts after a frequency of a high frequency power is adjusted in a case where the second mode is selected.
Figure 20:
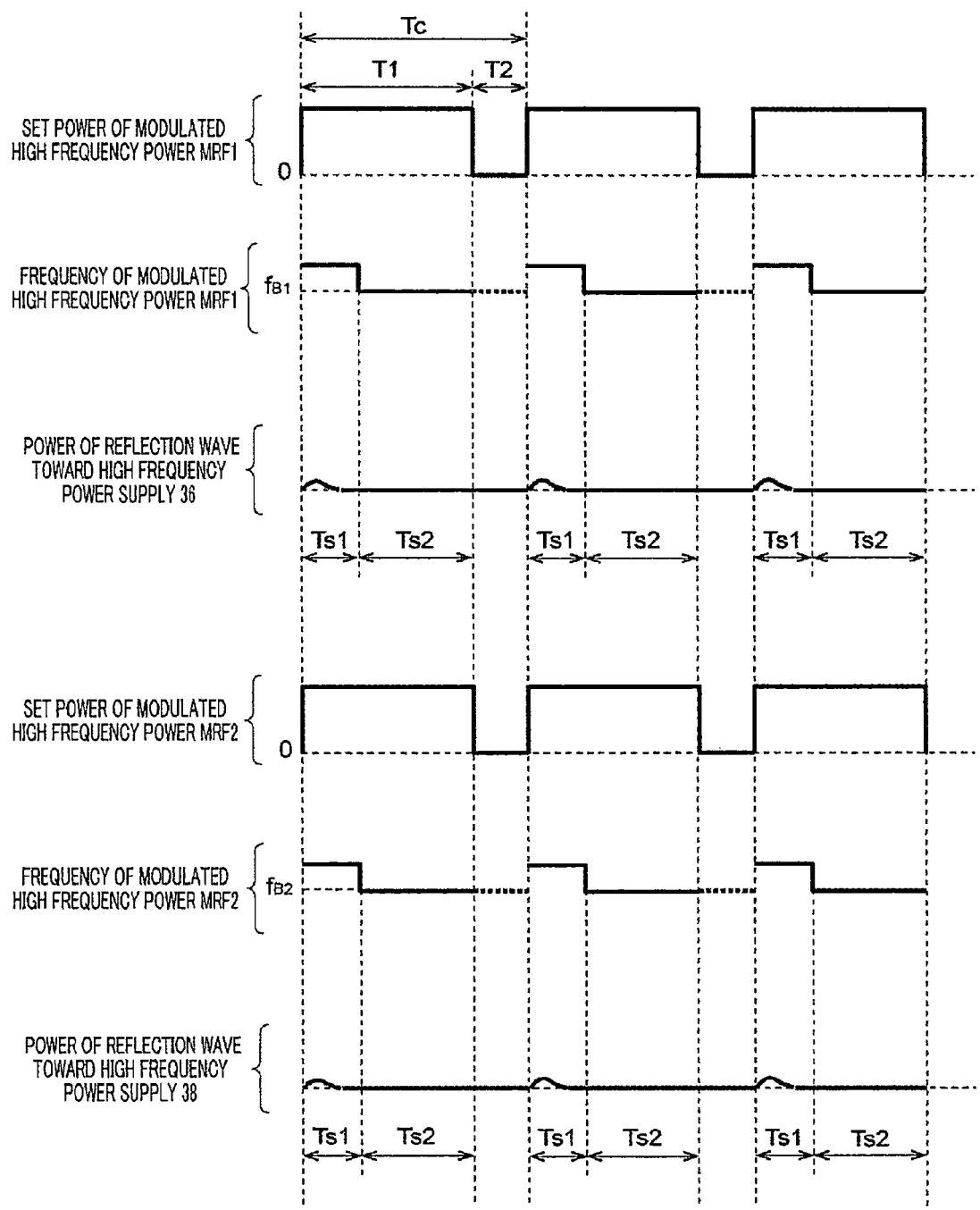
FIG. 20 illustrates timing charts after a frequency of a high frequency power is adjusted in a case where the third mode is selected.
Figure 21A:
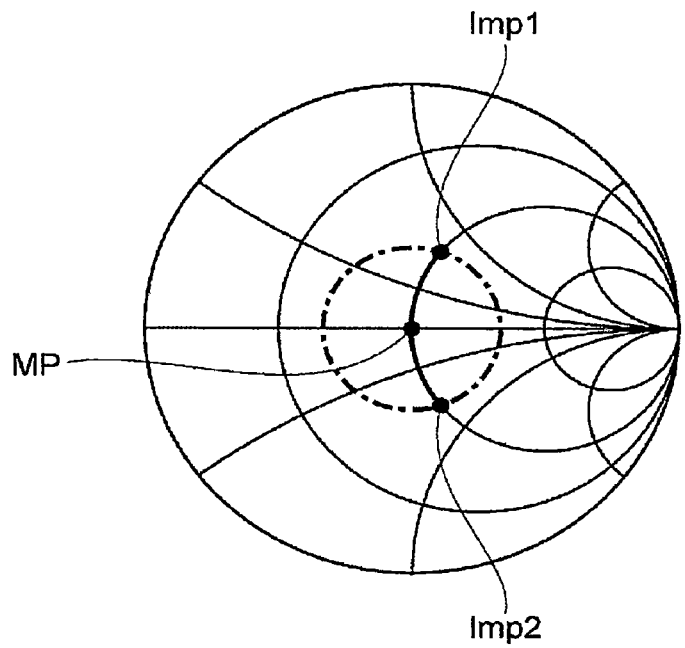
FIG. 21A and FIG. 21B are diagrams illustrating an example of the Smith chart which plots moving average values (impedance at a load side of a high frequency power supply)
Figure 21B:
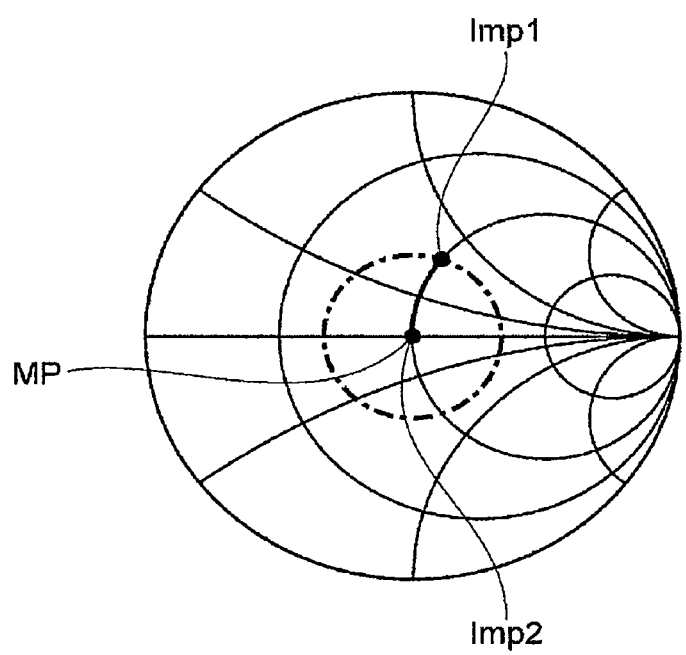
Figure 22:
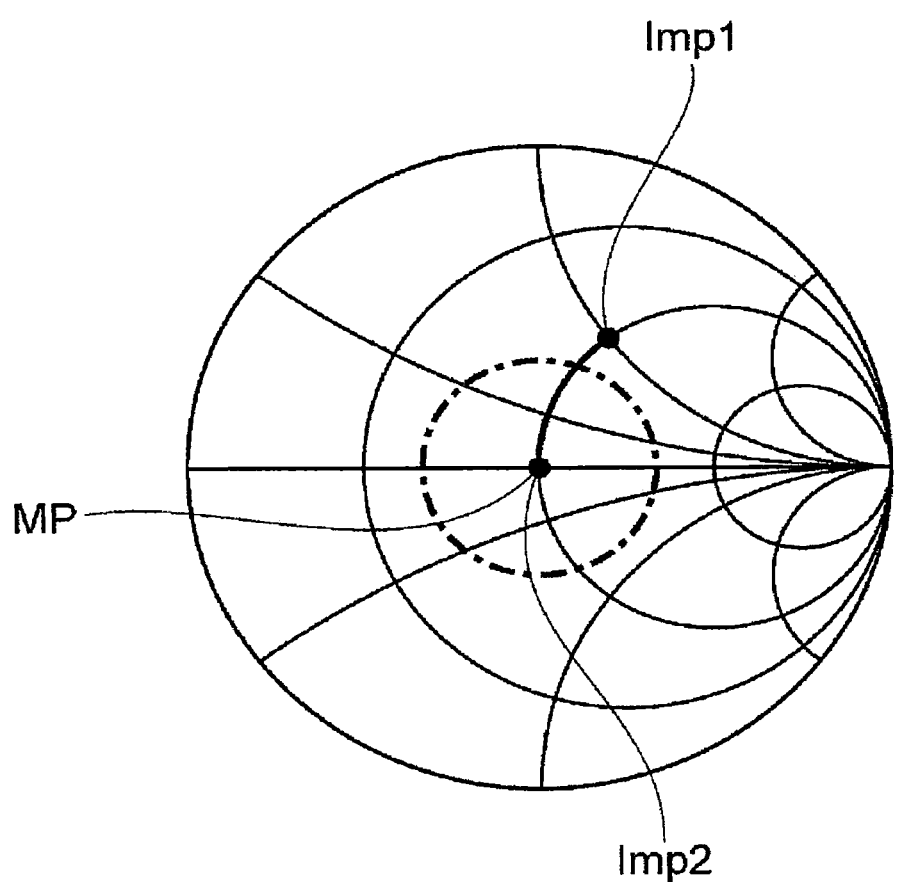
FIG. 22 is a diagram illustrating an example of the Smith chart which plots moving average values (impedance at a load side of a high frequency power supply)

Now, referring to FIG. 11, a method MT for the impedance matching of the plasma processing apparatus according to the exemplary embodiment will be explained. In the following description, reference is made to FIG. 12 to FIG. 20. FIG. 12 depicts timing charts before the impedance matching by the matching device is performed in a case where the first mode is selected. FIG. 13 depicts timing charts before the impedance matching by the matching device is performed in a case where the second mode is selected. FIG. 14 depicts timing charts before the impedance matching by the matching device is performed in a case where the third mode is selected. FIG. 15 depicts timing charts after the impedance matching by the matching device is performed in a case where the first mode is selected. FIG. 16 depicts timing charts after the impedance matching by the matching device is performed in a case where the second mode is selected. FIG. 17 depicts timing charts after the impedance matching by the matching device is performed in a case where the third mode is selected. FIG. 18 depicts timing charts after the frequency of the high frequency power is adjusted in a case where the first mode is selected. FIG. 19 depicts timing charts after the frequency of the high frequency power is adjusted in a case where the second mode is selected. FIG. 20 depicts timing charts after the frequency of the high frequency power is adjusted in a case where the third mode is selected. Further, in the embodiment of the method MT to be described with reference to FIG. 12 to FIG. 20, the power of the modulated high frequency power in the second period T2 is 0 W. Further, in the following description, reference is also made to FIG. 21A to FIG. 23. FIG. 21A to FIG. 22 are diagrams illustrating Smith charts which plot moving average values (load impedance of high frequency power supply).

Figure 11:
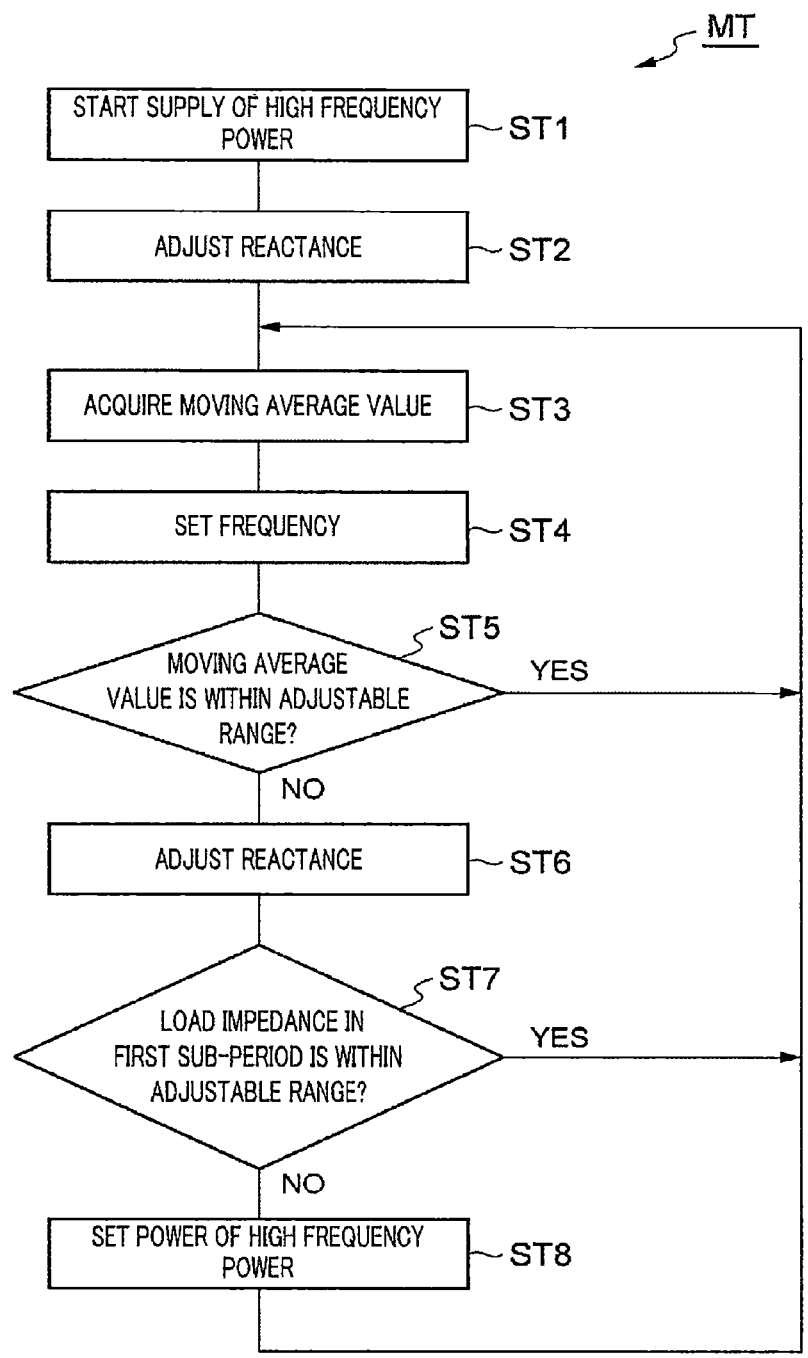
FIG. 11 is a flowchart for describing a method for impedance matching of the plasma processing apparatus according to the exemplary embodiment.

As shown in FIG. 11, the method MT is begun by starting the supply of the high frequency power in a process ST1. To elaborate, in case that the first mode is selected, the output of the modulated high frequency power MRF1 from the high frequency power supply 36 is started, and the output of the continuous power CRF2 from the high frequency power supply 38 is started, as depicted in FIG. 12. The frequency of the modulated high frequency power MRF1 is the basic frequency $f_{B1}$, and the frequency of the continuous power CRF2 is the basic frequency $f_{B2}$. In case that the second mode is selected, the output of the modulated high frequency power MRF2 from the high frequency power supply 38 is started, and the output of the continuous power CRF1 from the high frequency power supply 36 is started, as depicted in FIG. 13. The frequency of the modulated high frequency power MRF2 is the basic frequency $f_{B2}$, and the frequency of the continuous power CRF1 is the basic frequency $f_{B1}$. Furthermore, in case that the third mode is selected, the output of the modulated high frequency power MRF1 from the high frequency power supply 36 and the output of the modulated high frequency power MRF2 from the high frequency power supply 38 are started, as depicted in FIG. 14. The frequency of the modulated high frequency power MRF1 is the basic frequency $f_{B1}$, and the frequency of the modulated high frequency power MRF2 is the basic frequency $f_{B2}$.

Immediately after the process ST1 is begun, the impedance matching by the matching device 40 and the impedance matching by the matching device 42 are not performed, and the reflection wave is generated over the first period T1 and the second period T2, as shown in FIG. 12 to FIG. 14.

In a subsequent process ST2, the reactance of the variable reactance element 40g of the matching device 40 and the reactance of the variable reactance element 40h of the matching device 40 are adjusted. Further, the reactance of the variable reactance element 42g of the matching device 42 and the reactance of the variable reactance element 42h of the matching device 42 are adjusted.

To be specific, in the process ST2, in any case where the first mode, the second mode or the third mode is selected, the matching controller 40c of the matching device 40 adjusts the reactance of each of the variable reactance elements 40g and 40h through the actuators 40d and 40e such that the load impedance of the high frequency power supply 36 specified by the moving average value Imp21 approximates to the matching point (e.g., 50Ω, phase of 0). Alternatively, the matching controller 40c may adjust the reactance of each of the variable reactance elements 40g and 40h through the actuators 40d and 40e such that the load impedance of the high frequency power supply 36 specified by the moving average value Imp22 approximates to the matching point. Further, in case that the second mode is selected, the matching controller 40c may adjust the reactance of each of the variable reactance elements 40g and 40h through the actuators 40d and 40e such that the load impedance of the high frequency power supply 36, which is specified by the average value of the moving average value Imp21 and the moving average value Imp22, approximates to the matching point.

Further, in the process ST2, in any case where the first mode, the second mode or the third mode is selected, the matching controller 42c of the matching device 42 adjusts the reactance of each of the variable reactance elements 42g and 42h through the actuators 42d and 42e such that the load impedance of the high frequency power supply 38 specified by the moving average value Imp41 approximates to the matching point (e.g., 50Ω, phase of 0). Alternatively, the matching controller 42c may adjust the reactance of each of the variable reactance elements 42g and 42h through the actuators 42d and 42e such that the load impedance of the high frequency power supply 38 specified by the aforementioned moving average value Imp42 approximates to the matching point. Further, in case that the first mode is selected, the matching controller 42c may adjust the reactance of each of the variable reactance elements 42g and 40h through the actuators 42d and 42e such that the load impedance of the high frequency power supply 38 specified by the average value of the moving average value Imp41 and the moving average value Imp42.

If the impedance matching in the process ST2 is completed, the matching controller 40c outputs the aforementioned completion signal to the power supply controller 36e. Further, the matching controller 42c outputs the aforementioned completion signal to the power supply controller 38e. As depicted in FIG. 15 to FIG. 17, after the process ST2 is completed, the reflection waves in a period except the first sub-period Ts1 are suppressed as compared to the reflection wave in the first sub-period Ts1 in any case where the first mode, the second mode or the third mode is selected.

In a subsequent process ST3, the moving average value is acquired. To elaborate, in any case where the first mode, the second mode or the third mode is selected, after the process ST2 is completed, the power supply controller 36e acquires the moving average value Imp11 of the load impedance of the high frequency power supply 36 in the preset number of most recent first sub-periods Ts1. Further, after the process ST2 is completed, the power supply controller 36e acquires the moving average value Imp12 of the load impedance of the high frequency power supply 36 in the preset number of most recent second sub-periods Ts2. Further, in any case where the first mode, the second mode or the third mode is selected, after the process ST2 is completed, the power supply controller 38e acquires the moving average value Imp31 of the load impedance of the high frequency power supply 38 in the preset number of most recent first sub-periods Ts1. In addition, after the process ST2 is completed, the power supply controller 38e acquires the moving average value Imp32 of the load impedance of the high frequency power supply 38 in the preset number of most recent second sub-periods Ts2.

In a subsequent process ST4, the frequency of each of the high frequency power RF1 (modulated high frequency power MRF1 or continuous power CRF1) and the high frequency power RF2 (modulated high frequency power MRF2 or continuous power CRF2) are adjusted. To elaborate, in any case where the first mode, the second mode or the third mode is selected, as depicted in FIG. 18 to FIG. 20, in order to allow the load impedance of the high frequency power supply 36 in the first sub-period Ts1, which is estimated from the moving average value Imp11, and the load impedance of the high frequency power supply 36 in the second sub-period Ts2, which is estimated from the moving average value Imp12 to approximate to the matching point, the power supply controller 36e outputs, to the oscillator 36a, the frequency control signal for setting the frequency of the high frequency power RF1 in each of the first sub-period Ts1 and the second sub-period Ts2. Then, the oscillator 36a adjusts the frequency of the high frequency power in the first sub-period Ts1 and the frequency of the high frequency power in the second sub-period Ts2 according to the corresponding frequency control signal. Further, as depicted in FIG. 18 to FIG. 20, the frequency of the high frequency power RF1 (modulated high frequency power MRF1 or continuous power CRF1) in the second sub-period Ts2 may be adjusted to the basic frequency $f_{B1}$.

Further, in any case where the first mode, the second mode or the third mode is selected, in order to allow the load impedance of the high frequency power supply 38 in the first sub-period Ts1, which is estimated from the moving average value Imp31, and the load impedance of the high frequency power supply 38 in the second sub-period Ts2, which is estimated from the moving average value Imp32, to approximate to the matching point, the power supply controller 38e outputs, to the oscillator 38a, the frequency control signal for setting the frequency of the high frequency power RF2 in each of the first sub-period Ts1 and the second sub-period Ts2, as shown in FIG. 18 to FIG. 20. Then, the oscillator 38a adjusts the frequency of the high frequency power in the first sub-period Ts1 and the frequency of the high frequency power in the second sub-period Ts2 according to the corresponding frequency control signal. Further, as depicted in FIG. 18 to FIG. 20, the frequency of the high frequency power RF2 (modulated high frequency power MRF2 or continuous power CRF2) in the second sub-period Ts2 may be adjusted to the basic frequency $f_{B2}$.

After this process ST4 is performed, the reflection wave in the first sub-period Ts1 is suppressed in any case where the first mode, the second mode or the third mode is selected, as show in FIG. 18 to FIG. 20.

In case that the first mode or the third mode is selected, the power supply controller 36e determines, in a subsequent process ST5, whether the moving average value Imp11 and the moving average value Imp12 is within the aforementioned adjustable range. If both the moving average value Imp11 and the moving average value Imp12 are within the adjustable range, the method MT proceeds to a process ST3. Meanwhile, if at least one of the moving average value Imp11 and the moving average value Imp12 is out of the aforementioned adjustable range, the matching control signal for allowing the median impedance between the moving average value Imp11 and the moving average value Imp12 to approximate to the matching point is input to the matching device 40 from the power supply controller 36e. Then, in a subsequent process ST6, the reactance of each of the variable reactance elements 40g and 40h of the matching device 40 is adjusted according to the matching control signal. Accordingly, the load impedance of the high frequency power supply 36 in the first sub-period Ts1 and the load impedance of the high frequency power supply 36 in the second sub-period Ts2 are adjusted as indicated by reference numerals Imp1 and Imp2 in FIG. 21A, for example. Further, in FIG. 21A and FIG. 21B, a notation MP indicates the matching point, and the adjustable range is indicated by a dashed line.

Alternatively, if at least one of the moving average value Imp11 and the moving average value Imp12 is out of the aforementioned adjustable range, the matching control signal for allowing the load impedance of the high frequency power supply 36, which is estimated from the moving average value Imp12, to approximate to the matching point is input to the matching device 40 from the power supply controller 36e. Then, in the subsequent process ST6, the reactance of each of the variable reactance elements 40g and 40h of the matching device 40 is adjusted according to the matching control signal. Accordingly, the load impedance of the high frequency power supply 36 in the first sub-period Ts1 and the load impedance of the high frequency power supply 36 in the second sub-period Ts2 are adjusted as indicated by the reference numerals Imp1 and Imp2 in FIG. 21B, for example.

Furthermore, in case that the second mode or the third mode is selected, the power supply controller 38e determines, in the process ST5, whether the moving average value Imp31 and the moving average value Imp32 is within the aforementioned adjustable range. If both the moving average value Imp31 and the moving average value Imp32 are within the adjustable range, the method MT proceeds to the process ST3. Meanwhile, if at least one of the moving average value Imp31 and the moving average value Imp32 is out of the aforementioned adjustable range, the matching control signal for allowing the median impedance between the moving average value Imp31 and the moving average value Imp32 to approximate to the matching point is input to the matching device 42 from the power supply controller 38e. Then, in the subsequent process ST6, the reactance of each of the variable reactance elements 42g and 42h of the matching device 42 is adjusted according to the matching control signal. Accordingly, the load impedance of the high frequency power supply 38 in the first sub-period Ts1 and the load impedance of the high frequency power supply 38 in the second sub-period Ts2 are adjusted as indicated by the reference numerals Imp1 and Imp2 in FIG. 21A, for example.

Alternatively, if at least one of the moving average value Imp31 and the moving average value Imp32 is out of the aforementioned adjustable range, the matching control signal for allowing the load impedance of the high frequency power supply 38, which is estimated from the moving average value Imp32, to approximate to the matching point is input to the matching device 42 from the power supply controller 38e. Then, in the subsequent process ST6, the reactance of each of the variable reactance elements 42g and 42h of the matching device 42 is adjusted according to this matching control signal. Accordingly, the load impedance of the high frequency power supply 38 in the first sub-period Ts1 and the load impedance of the high frequency power supply 38 in the second sub-period Ts2 are adjusted as indicated by reference numerals Imp1 and Imp2 in FIG. 21B, for example.

Figure 23:
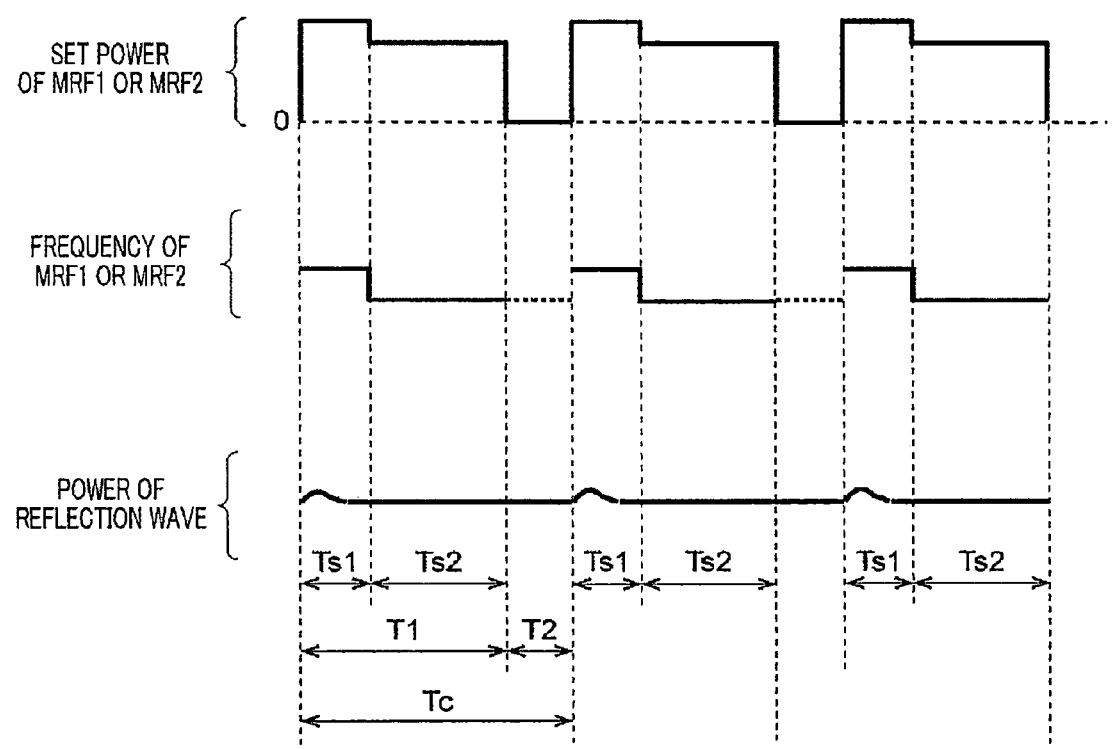
FIG. 23 illustrates timing charts in a process ST8.

In the process ST6, if the reactance of each of the variable reactance elements 40g and 40h of the matching device 40 is adjusted such that the load impedance of the high frequency power supply 36, which is estimated from the moving average value Imp12, approximates to the matching point, it is determined, in a subsequent process ST7, whether the load impedance of the high frequency power supply 36 in the first sub-period Ts1 is out of the adjustable range. If the load impedance of the high frequency power supply 36 in the first sub-period Ts1 is within the adjustable range, the method MT proceeds to the process ST3. Meanwhile, as shown in FIG. 22, if the load impedance (see, Imp1 in FIG. 22) of the high frequency power supply 36 in the first sub-period Ts1 is out of the adjustable range, the power of the modulated high frequency power MRF1 is set by the power supply controller 36e such that the power of the modulated high frequency power MRF1 in the first sub-period Ts1 is larger than the power of the modulated high frequency power MRF1 in the second sub-period Ts2 in a process ST8, as shown in FIG. 23. Then, the method MT proceeds to the process ST3.

Further, in the process ST6, if the reactance of each of the variable reactance elements 42g and 42h of the matching device 42 is adjusted such that the load impedance of the high frequency power supply 38, which is estimated from the moving average value Imp32, approximates to the matching point, it is determined, in the subsequent process ST7, whether the load impedance of the high frequency power supply 38 in the first sub-period Ts1 is out of the adjustable range. If the load impedance of the high frequency power supply 38 in the first sub-period Ts1 is within the adjustable range, the method MT proceeds to the process ST3. Meanwhile, as shown in FIG. 22, if the load impedance (see, Imp in FIG. 22) of the high frequency power supply 38 in the first sub-period Ts1 is out of the adjustable range, the power of the modulated high frequency power MRF2 is set by the power supply controller 38e such that the power of the modulated high frequency power MRF2 in the first sub-period Ts1 is larger than the power of the modulated high frequency power MRF2 in the second sub-period Ts2 in the process ST8, as shown in FIG. 23. Then, the method MT proceeds to the process ST3.

Further, in the method MT, a series of processes starting from the process ST3 in which the moving average values are updated is repeated until the supplies of the high frequency power RF1 and the high frequency power RF2 are stopped under the control of the main controller 72.

Furthermore, in the method MT, regarding the continuous power output from the high frequency power supply, the frequency of the continuous power in the first sub-period and the frequency of the continuous power in the second sub-period are adjusted according to the moving average value. However, the frequency of the continuous power may not be adjusted but may be maintained constant.

As stated above, in the method MT, the frequency of the modulated high frequency power from the high frequency power supply in each of the first sub-period Ts1 and the second sub-period Ts2 is set according to the moving average value of the load impedance of the high frequency power supply in each of the past first sub-periods Ts1 and the past second sub-periods Ts2. Accordingly, the frequency of the modulated high frequency power can be adjusted adaptively and rapidly according to the variation in the load impedance of the high frequency power supply in the first period T1.

Furthermore, in the process ST8 of the method MT, the power of the modulated high frequency power in the first sub-period Ts1 is increased. Thus, the modulated high frequency power having a sufficient power level can be supplied to the plasma in the first sub-period Ts1.

Figure 24:
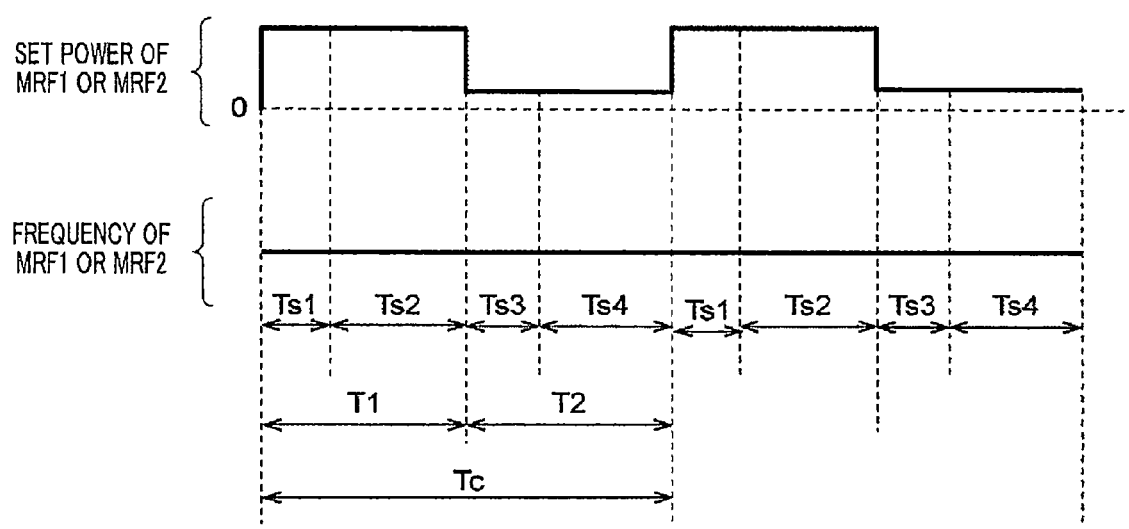
FIG. 24 illustrates timing charts according to another exemplary embodiment.
Figure 25:
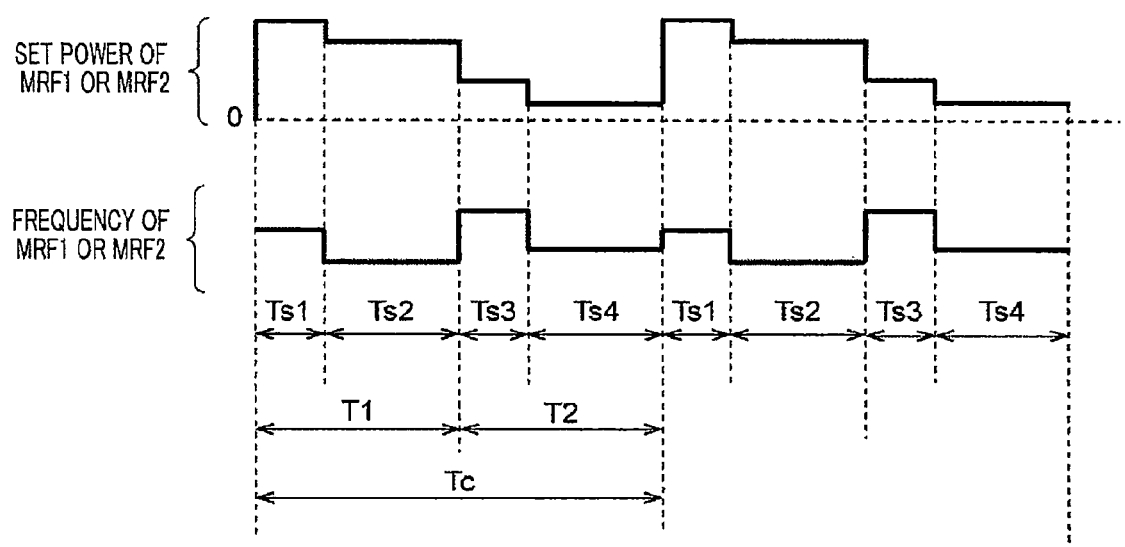
FIG. 25 illustrates timing charts according to still another exemplary embodiment.

Now, other exemplary embodiments will be explained. FIG. 24 and FIG. 25 provide timing charts according to other exemplary embodiments. Here, only distinctive features from the aforementioned method MT will be discussed.

In another exemplary embodiment, in the process ST1, the output of the modulated high frequency power, which has a power larger than 0 W in the second period T2, is started from the high frequency power supply 36 and/or the high frequency power supply 38, as shown in FIG. 24.

In the process ST3 of this exemplary embodiment, in case that the first mode or the third mode is selected, the power supply controller 36e further acquires the moving average value Imp13 of the load impedance of the high frequency power supply 36 in a preset number of most recent third sub-period Ts3. Further, the power supply controller 36e further acquires the moving average value Imp14 of the load impedance of the high frequency power supply 36 in a preset number of most recent fourth sub-period Ts4. Further, in case that the second mode or the third mode is selected, the power supply controller 38e further acquires the moving average value Imp33 of the load impedance of the high frequency power supply 38 in the preset number of most recent third sub-period Ts3. Further, the power supply controller 38e further acquires the moving average value Imp34 of the load impedance of the high frequency power supply 38 in the preset number of most recent fourth sub-period Ts4.

In case that the first mode or the third mode is selected, in the process ST4, in order to allow the load impedance of the high frequency power supply 36 in the third sub-period Ts3, which is estimated from the moving average value Imp13, and the load impedance of the high frequency power supply 36 in the fourth sub-period Ts4, which is estimated from the moving average value Imp14, to approximate to the matching point, the power supply controller 36e outputs, to the oscillator 36a, the frequency control signal for setting the frequency of the modulated high frequency power MRF1 in each of the third sub-period Ts3 and the fourth sub-period Ts4, as shown in FIG. 25. Then, the oscillator 36a adjusts the frequency of the high frequency power in the third sub-period Ts3 and the frequency of the high frequency power in the fourth sub-period Ts4 according to the corresponding frequency control signal.

Further, in case that the second mode or the third mode is selected, in the process ST4, in order to allow the load impedance of the high frequency power supply 38 in the third sub-period Ts3, which is estimated from the moving average value Imp33, and the load impedance of the high frequency power supply 38 in the fourth sub-period Ts4, which is estimated from the moving average value Imp34, to approximate to the matching point, the power supply controller 38e outputs, to the oscillator 38a, the frequency control signal for setting the frequency of the modulated high frequency power MRF2 in each of the third sub-period Ts3 and the fourth sub-period Ts4. Then, the oscillator 38a adjusts the frequency of the high frequency power in the third sub-period Ts3 and the frequency of the high frequency power in the fourth sub-period Ts4 according to the corresponding frequency control signal.

In case of adjusting the reactance of the variable reactance elements 40g and 40h of the matching device 40 such that the load impedance of the high frequency power supply 36, which is estimated from the moving average value Imp12, approximates to the matching point, the power of the modulated high frequency power MRF1 is set by the power supply controller 36e such that the power of the modulated high frequency power MRF1 in the third sub-period Ts3 is larger than the power of the modulated high frequency power MRF1 in the fourth sub-period Ts4 in the process ST8, as shown in FIG. 25.

Moreover, in case of adjusting the reactance of the variable reactance elements 42g and 42h of the matching device 42 such that the load impedance of the high frequency power supply 38, which is estimated from the moving average value Imp32, approximates to the matching point, the power of the modulated high frequency power MRF2 is set by the power supply controller 38e such that the power of the modulated high frequency power MRF2 in the third sub-period Ts3 is larger than the power of the modulated high frequency power MRF2 in the fourth sub-period Ts4 at the process ST8.

According to the present exemplary embodiment, the frequency of the modulated high frequency power is adjusted adaptively and rapidly according to the variation in the load impedance of the high frequency power supply in the first period T1 and the second period T2. Further, the modulated high frequency power having a sufficient power level is supplied to the plasma in the third sub-period Ts3.

So far, the various exemplary embodiments have been described. However, it should be noted that the above-described exemplary embodiments are not limiting, and various modifications may be made. In the above-described exemplary embodiments, the first period T1 is divided into two: the first sub-period Ts1 and the second sub-period Ts2. However, the first period T1 may be divided into three or more sub-periods including the first sub-period Ts1 and the second sub-period Ts2. In such a case, the frequency the a modulated high frequency power output from the high frequency power supply is adjusted in each of the three or more sub-periods of the first period T1 based on the moving average value of the load impedance of the high frequency power supply in each of the three or more sub-periods of the first period T1. Further, the second period T2 may be divided into three or more sub-periods including the third sub-period Ts3 and the fourth sub-period Ts4. In such a case, the frequency of the modulated high frequency power output from the high frequency power supply is adjusted in each of the three or more sub-periods of the second period T2 based on the moving average value of the load impedance of the high frequency power supply in each of the three or more sub-periods of the second period T2.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting.

We claim:

1. A method for impedance matching comprising:
providing a plasma processing apparatus which comprises:
a processing vessel;
a first electrode and a second electrode disposed with a space therebetween within the processing vessel;
a first high frequency power supply configured to output a high frequency power for plasma generation;
a second high frequency power supply configured to output a high frequency power for ion attraction;
a first power feed line configured to connect the first electrode or the second electrode to the first high frequency power supply;
a second power feed line configured to connect the second electrode to the second high frequency power supply;
a first matching device configured to adjust a load impedance of the first high frequency power supply; and
a second matching device configured to adjust a load impedance of the second high frequency power supply;
starting an output of a modulated high frequency power, which is set such that a power of the modulated high frequency power in a second period is smaller than a power of the modulated high frequency power in a first period, from one high frequency power supply of the first high frequency power supply and the second high frequency power supply, the first period and the second period being repeated alternately;

adjusting, by one matching device of the first matching device and the second matching device which corresponds to the one high frequency power supply, a reactance of a variable reactance element of the one matching device such that the load impedance of the one high frequency power supply approximates to a matching point;

acquiring a first moving average value and a second moving average value by a power supply controller corresponding to the one high frequency power supply, the first moving average value being a moving average value of the load impedance of the one high frequency power supply in a first sub-period from a start point to a preset point of each first period after the adjusting of the reactance of the variable reactance element of the one matching device, and the second moving average value being a moving average value of the load impedance of the one high frequency power supply in a second sub-period from the preset point to an end point of each first period after the adjusting of the reactance of the variable reactance element of the one matching device; and setting, by the power supply controller corresponding to the one high frequency power supply, after the first moving average value and the second moving average value are acquired, a frequency of the modulated high frequency power output from the one high frequency power supply, in each of the first sub-period and the second sub-period such that the load impedance of the one high frequency power supply in the first sub-period, which is estimated from the first moving average value, and the load impedance of the one high frequency power supply in the second sub-period, which is estimated from the second moving average value, approximate to the matching point.

2. The method of claim 1, further comprising:

adjusting, by the other matching device of the first matching device and the second matching device, a reactance of a variable reactance element of the other matching device such that the load impedance of the other high frequency power supply approximates to the matching point;

acquiring a third moving average value and a fourth moving average value by a power supply controller corresponding to the other high frequency power supply, the third moving average value being a moving average value of the load impedance of the other high frequency power supply in the first sub-period after the adjusting of the reactance of the variable reactance element of the other matching device, and the fourth moving average value being a moving average value of the load impedance of the other high frequency power supply in the second sub-period after the adjusting of the reactance of the variable reactance element of the other matching device; and setting, by the power supply controller corresponding to the other high frequency power supply, after the third moving average value and the fourth moving average value are acquired, a frequency of a high frequency power output from the other high frequency power supply in each of the first sub-period and the second sub-period such that the load impedance of the other high frequency power supply in the first sub-period, which is estimated from the third moving average value, and the load impedance of the other high frequency power supply in the second sub-period, which is estimated from the fourth moving average value, approximate to the matching point.

3. The method of claim 1, further comprising:

adjusting the reactance of the variable reactance element of the one matching device such that the load impedance of the one high frequency power supply in the first sub-period, which is estimated from the first moving average value, and the load impedance of the one high frequency power supply in the second sub-period, which is estimated from the second moving average value, approximate to the matching point.

4. The method of claim 1, further comprising:

adjusting the reactance of the variable reactance element of the one matching device such that the load impedance of the one high frequency power supply in the second sub-period, which is estimated from the second moving average value, approximates to the matching point.

5. The method of claim 4, further comprising:

setting, by the power supply controller corresponding to the one high frequency power supply, a power of the modulated high frequency power output from the one high frequency power supply, such that the power of the modulated high frequency power output from the one high frequency power supply in the first sub-period is larger than the power of the modulated high frequency power output from the one high frequency power supply in the second sub-period.

6. The method of claim 5, further comprising:

acquiring a fifth moving average value and a sixth moving average value by the power supply controller corresponding to the one high frequency power supply, the fifth moving average value being a moving average value of the load impedance of the one high frequency power supply in a third sub-period from a start point to a preset point of each second period after the adjusting of the reactance of the variable reactance element of the one matching device, and the sixth moving average value being a moving average value of the load impedance of the one high frequency power supply in a fourth sub-period from the preset point to an end point of each second period after the adjusting of the reactance of the variable reactance element of the one matching device; and setting, by the power supply controller corresponding to the one high frequency power supply, after the fifth moving average value and the sixth moving average value are acquired, a frequency of the modulated high frequency power output from the one high frequency power supply, in each of the third sub-period and the fourth sub-period such that the load impedance of the one high frequency power supply in the third sub-period, which is estimated from the fifth moving average value, and the load impedance of the one high frequency power supply in the fourth sub-period, which is estimated from the sixth moving average value, approximate to the matching point, wherein the one high frequency power supply outputs the high frequency power having a power larger than 0 W in the second period.

7. The method of claim 6, further comprising:
setting, by the power supply controller corresponding to the one high frequency power supply, a power of the modulated high frequency power output from the one high frequency power supply, such that the power of the modulated high frequency power output from the one high frequency power supply in the third sub-period is larger than the power of the modulated high frequency power output from the one high frequency power supply in the fourth sub-period.

* * * * *